(12) United States Patent
Kiuchi et al.

(10) Patent No.: US 10,933,500 B2
(45) Date of Patent: Mar. 2, 2021

(54) BLADE MOUNTING AND DISMOUNTING JIG, BLADE MOUNTING AND DISMOUNTING METHOD, BLADE EXTRACTING METHOD, AND CUTTING APPARATUS

(71) Applicant: DISCO CORPORATION, Tokyo (JP)

(72) Inventors: Hayato Kiuchi, Tokyo (JP); Hajime Kameda, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 122 days.

(21) Appl. No.: 16/025,063

(22) Filed: Jul. 2, 2018

(65) Prior Publication Data

US 2019/0009379 A1  Jan. 10, 2019

(30) Foreign Application Priority Data

Jul. 4, 2017 (JP) .............................. JP2017-131101

(51) Int. Cl.
*B24B 45/00* (2006.01)
*B23Q 3/157* (2006.01)
(Continued)

(52) U.S. Cl.
CPC ...... *B23Q 3/15503* (2016.11); *B23Q 3/15713* (2013.01); *B24B 45/006* (2013.01);
(Continued)

(58) Field of Classification Search
CPC ............. Y10T 483/10; Y10T 483/1736; Y10T 483/174; Y10T 483/1752; Y10T 483/1755; B23Q 3/157; B24B 27/06; B24B 27/0675; B24B 47/10; B24B 47/14; B24B 7/00; B24B 7/005; B24B 45/00; B24B 45/003; B24B 45/006; B23B 31/307; B28D 5/02; B26D 1/14; B26D 7/2621; B25J 15/065;
(Continued)

(56) References Cited

U.S. PATENT DOCUMENTS 3,167,992 A * 2/1965 Kury ..................... B26D 7/2614
                                                    83/699.41
4,780,951 A * 11/1988 Beyer ..................... B23Q 11/08
                                                    483/18
(Continued)

FOREIGN PATENT DOCUMENTS

JP          2013222834 A     10/2013

*Primary Examiner* — Erica E Cadugan
*Assistant Examiner* — Yasir A Diab
(74) *Attorney, Agent, or Firm* — Greer, Burns & Crain, Ltd.

(57) ABSTRACT

A blade mounting and dismounting jig is provided for mounting a blade on and dismounting a blade from a flange of a cutting apparatus which includes a boss, a blade mount for mounting the blade fitted thereover, the flange having an annular end face for supporting the blade thereon and being fixed to a distal end of a spindle, and a holder that cooperates with the flange in gripping and securing the blade in position. The blade mounting and dismounting jig includes a cylindrical jig body, a grip coupled to the jig body and having a diameter larger than the jig body, a plurality of first air ejection ports defined in a distal end portion of the jig body, a plurality of second air ejection ports defined in the jig body at a juncture between the jig body and the grip.

20 Claims, 16 Drawing Sheets

(51) Int. Cl.
  *B28D 5/02* (2006.01)
  *B23Q 3/155* (2006.01)
  *H01L 21/67* (2006.01)
  *B27B 5/32* (2006.01)
  *B23Q 13/00* (2006.01)
  *B28D 5/00* (2006.01)
  *B23Q 11/08* (2006.01)

(52) U.S. Cl.
  CPC .............. *B27B 5/325* (2013.01); *B28D 5/022* (2013.01); *H01L 21/67092* (2013.01); *B23Q 11/0825* (2013.01); *B23Q 11/0891* (2013.01); *B23Q 13/00* (2013.01); *B23Q 2003/155418* (2016.11); *B23Q 2003/155428* (2016.11); *B23Q 2003/155439* (2016.11); *B28D 5/0076* (2013.01); *B28D 5/0082* (2013.01); *Y10T 483/10* (2015.01); *Y10T 483/174* (2015.01)

(58) Field of Classification Search
  CPC .... B25J 15/0658; B25B 11/00; B25B 11/005; B25B 11/02
  USPC .................................................. 294/64.3, 183
  See application file for complete search history.

(56) References Cited

U.S. PATENT DOCUMENTS

| | | | | |
|---|---|---|---|---|
| 5,778,751 | A * | 7/1998 | Tsuchishima | B23D 61/10 125/15 |
| 6,030,326 | A * | 2/2000 | Azuma | B27B 5/30 483/31 |
| 6,341,600 | B1 * | 1/2002 | Wakita | B23D 61/10 125/13.01 |
| 7,258,601 | B2 * | 8/2007 | Sato | B24D 5/16 451/178 |
| 7,563,155 | B2 * | 7/2009 | Kumagai | B27B 5/32 125/13.01 |
| 9,833,922 | B2 * | 12/2017 | Nitta | B26D 7/2621 |
| 2006/0121840 | A1 * | 6/2006 | Kim | B24B 7/228 451/342 |
| 2015/0020666 | A1 * | 1/2015 | Wakita | B27B 5/32 83/401 |
| 2015/0020667 | A1 * | 1/2015 | Wakita | B27B 5/30 83/401 |
| 2015/0020670 | A1 * | 1/2015 | Wakita | H01L 21/304 83/522.12 |

* cited by examiner

BLADE MOUNTING AND DISMOUNTING JIG, BLADE MOUNTING AND DISMOUNTING METHOD, BLADE EXTRACTING METHOD, AND CUTTING APPARATUS

BACKGROUND OF THE INVENTION

Field of the Invention

The present invention relates to a jig and a method for mounting a blade on and dismounting a blade from a flange of a cutting apparatus, a method for extracting a blade from a storage case, and a cutting apparatus for cutting a workpiece such as a semiconductor wafer or the like.

Description of the Related Art

Cutting apparatus for cutting a wafer with a rotating cutting blade that is caused to incise the wafer includes a flange mounted on the distal end of a rotatable spindle, the cutting blade being detachably mounted on the flange (see, for example, Japanese Patent Laid-open No. 2013-222834).

SUMMARY OF THE INVENTION

For mounting the cutting blade on and dismounting the cutting blade from the flange, the operator grips a portion of the cutting blade by hand and mounts the cutting blade or dismounts the cutting blade from the flange. At this time, the cutting blade may possibly be broken depending on the way in which the operator applies a force to grip the cutting blade. For example, a washer-type cutting blade is more likely to be broken than a hub-type cutting blade during the process of being mounted on or dismounted from the flange because the washer-type cutting blade is free of a mount support but includes only a cutting edge. A cutting blade with a thin cutting edge is also liable to be broken during the process of being mounted on or dismounted from the flange.

It is therefore an object of the present invention to allow the operator to mount a cutting blade on a flange or dismount a cutting blade from a flange without directly touching the cutting blade by hand.

In accordance with an aspect of the present invention, there is provided a blade mounting and dismounting jig for mounting a blade on and dismounting a blade from a flange of a cutting apparatus which includes at least: a boss; a blade mount for mounting the blade fitted thereover; the flange having an annular end face for supporting the blade thereon and being fixed to a distal end of a spindle; and a holder that cooperates with the flange in gripping and securing the blade in position, the blade mounting and dismounting jig including: a cylindrical jig body having a recess defined in a distal end portion thereof, the distal end portion having a diameter same as that of the blade mount, the recess being receptive of the boss fitted therein; a grip coupled to the jig body and having a diameter larger than the jig body; a plurality of first air ejection ports defined in the distal end portion of the jig body; a plurality of second air ejection ports defined in the jig body at a juncture between the jig body and the grip; a first fluid communication route for bringing the first air ejection ports into fluid communication with an air source under control of a controller; and a second fluid communication route for bringing the second air ejection ports into fluid communication with the air source under control of the controller.

The blade mounting and dismounting jig should preferably further include an air guide member having at least an air guide surface that can be positioned in the direction of travel of air ejected radially outwardly from the second air ejection ports.

In accordance with another aspect of the present invention, there is also provided a blade mounting and dismounting method using the blade mounting and dismounting jig, for mounting the blade held on the jig body of the blade mounting and dismounting jig on said flange, including: a positioning step of causing the boss to fit into the recess, coupling the jig body and the blade mount to each other and positioning the jig body and the blade mount coaxially with each other; a mounting air ejecting step of instantaneously ejecting air from the first air ejection ports; and a moving step of moving the blade to the blade mount under a negative pressure produced between the blade and the flange.

In accordance with still another aspect of the present invention, there is also provided a blade mounting and dismounting method using the blade mounting and dismounting jig, for dismounting the blade held on the blade mount, including: a positioning step of causing the boss to fit into the recess, coupling the jig body and the blade mount to each other and positioning the jig body and the blade mount coaxially with each other; an extracting air ejecting step of instantaneously ejecting air from the second air ejection ports; and a moving step of moving the blade to the jig body under a negative pressure produced between the blade and the grip.

In accordance with yet another aspect of the present invention, there is also provided a blade extracting method for extracting a blade from a storage case storing therein the blade with one surface thereof exposed, using the blade mounting and dismounting jig, including: a positioning step of coupling the jig body and a mount hole in the blade to each other and positioning the jig body and the blade coaxially with each other; an extracting air ejecting step of ejecting air radially outwardly from the second air ejection ports; a guiding step of guiding the ejected air in a direction toward the blade with the air guide surface; and a moving step of moving the blade onto the jig body with a negative pressure produced between the blade and the grip and air entering between the storage case and the blade.

In accordance with yet still another aspect of the present invention, there is further provided a cutting apparatus including a boss, a blade mount for mounting a blade fitted thereover, a flange having an annular end face for supporting the blade thereon and fixed to a distal end of a spindle, a holder that cooperates with the flange in gripping and securing the blade in position, and an automatic blade changer mechanism for automatically mounting the blade on and dismounting the blade from the flange, wherein the automatic blade changer mechanism includes at least a blade rack for storing a blade to be used and a blade that has been used, and an arm that can be turned between the blade rack and the spindle, and the arm supports on an end thereof the blade mounting and dismounting jig according to claim 1, and an attaching/detaching unit configured to attach and detach the holder.

The blade mounting and dismounting jig according to the present invention includes at least the cylindrical jig body having the recess defined in the distal end portion thereof which is of the same diameter as the blade mount, the recess being receptive of the boss fitted therein, the grip joined to the jig body and having the diameter larger than the jig body, the plurality of first air ejection ports defined in the distal end portion of the jig body, the plurality of second air ejection ports defined in the jig body at the juncture between the jig body and the grip, the first fluid communication route for bringing the first air ejection ports into fluid communication with the air source under the control of the controller, and the second fluid communication route for bringing the second air ejection ports into fluid communication with the air source under the control of the controller. Since the blade mounting and dismounting jig allows the blade to be mounted on the flange in a contactless fashion under a negative pressure produced by air ejected from the first air ejection ports based on the Bernoulli's theorem and also allows the blade to be dismounted from the flange in a contactless fashion under a negative pressure produced by air ejected from the second air ejection ports based on the Bernoulli's theorem, the operator may stay out of direct touch with the blade in mounting and dismounting the blade. In addition, as the blade can be mounted and dismounted without forces concentrating on any spot thereof, the blade is prevented from being broken.

The blade mounting and dismounting jig further includes the air guide member having at least the air guide surface that can be positioned in the direction of travel of air ejected radially outwardly from the second air ejection ports. It is thus possible to extract the blade from the storage case where the blade is stored with one surface thereof exposed, and also possible to more effectively prevent the blade from being possibly broken until the blade stored in the storage case is mounted on the flange.

For mounting the blade held on the jig body of the blade mounting and dismounting jig on the flange, using the blade mounting and dismounting jig, the blade mounting and dismounting method according to the present invention includes the positioning step of coupling the jig body and the blade mount to each other and positioning them coaxially with each other, the mounting air ejecting step of instantaneously ejecting air from the first air ejection ports, and the moving step of moving the blade to the blade mount under a negative pressure produced between the blade and the flange. Therefore, the blade mounting and dismounting method makes it possible to mount the blade on the flange under a negative pressure in a contactless fashion without the operator directly touching the blade.

For dismounting the blade held on the blade mount, using the blade mounting and dismounting jig, the blade mounting and dismounting method according to the present invention includes the positioning step of coupling the jig body and the blade mount to each other and positioning them coaxially with each other, the dismounting air ejecting step of instantaneously ejecting air from the second air ejection ports, and the moving step of moving the blade to the jig body under a negative pressure produced between the blade and the grip. Therefore, the blade can be dismounted from the flange under a negative pressure in a contactless fashion without the operator directly touching the blade.

The blade extracting method for extracting the blade from the storage case where the blade is stored with one surface thereof exposed, using the blade mounting and dismounting jig including the air guide member carries out the positioning step of coupling the jig body and the mount hole in the blade to each other and positioning the jig body and the blade (the mount hole) coaxially with each other, the air ejecting step of ejecting air radially outwardly from the second air ejection ports, and the guiding step of guiding the ejected air in a direction toward the blade with the air guide surface of the air guide member, so that it is possible in the subsequent moving step to move the blade onto the jig body in a contactless fashion with a negative pressure produced between the blade and the grip and air entering between the storage case and the blade.

The cutting apparatus according to the present invention includes the automatic blade changer mechanism, and the automatic blade changer mechanism includes the blade rack for holding a blade to be used and a used blade that has been used and the arm that can be turned between the blade rack and the spindle. The arm supports on its end the blade mounting and dismounting jig and the attaching/detaching unit configured to attach and detach the holder. In mounting and dismounting the blade, the operator is not required to directly touch the blade, and the blade is automatically mounted on the flange and dismounted from the flange without forces concentrating on any spot of the blade. Therefore, the blade is prevented from being broken and can be mounted and dismounted highly efficiently.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
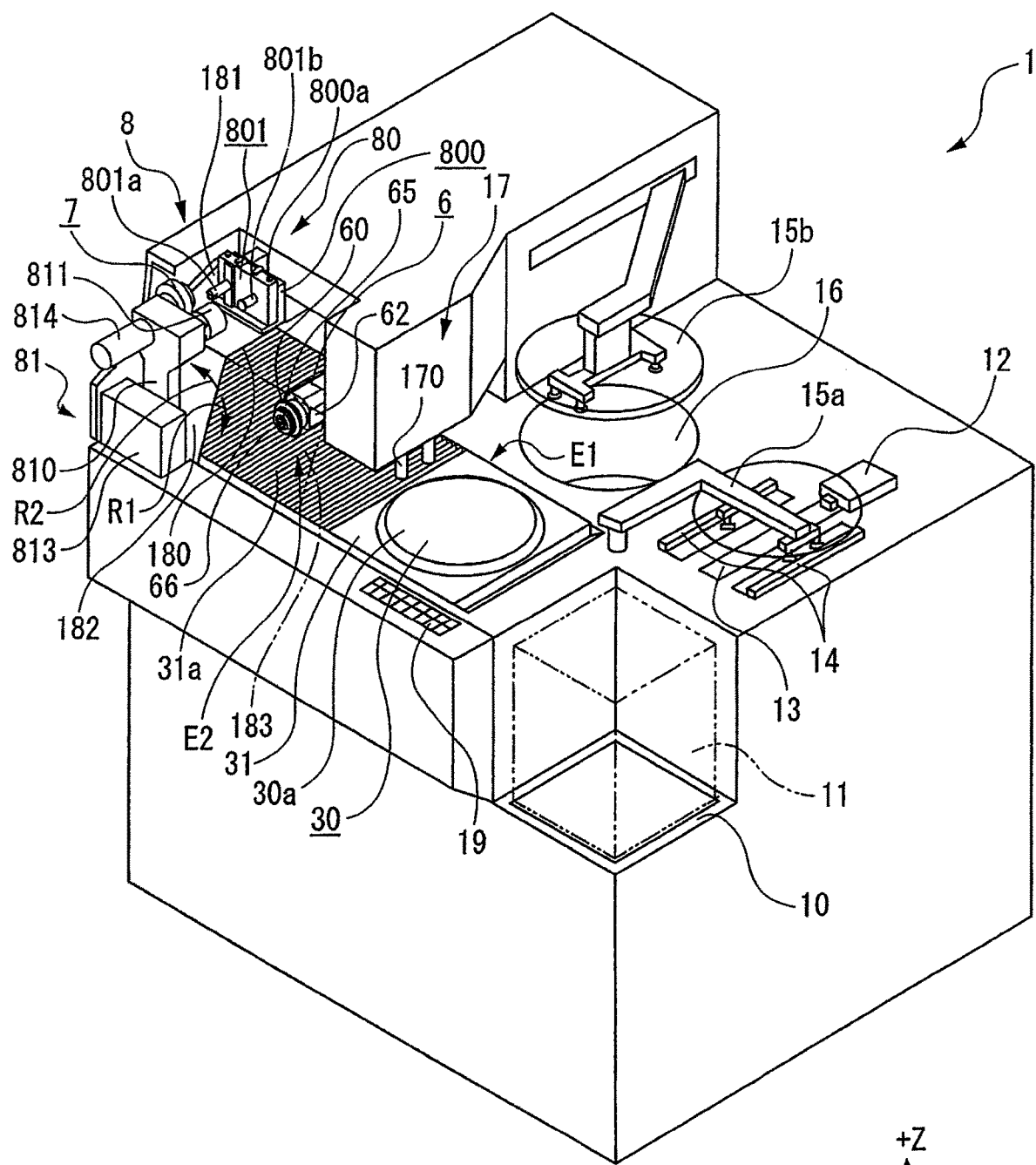
FIG. 1 is a perspective view of a cutting apparatus.
Figure 1:
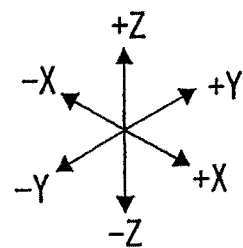

FIG. 1 shows a cutting apparatus 1 that serves as an apparatus for cutting a wafer held on a chuck table 30 with cutting means 6.

The cutting apparatus 1 includes a wafer cassette 11 disposed on a front side thereof (−Y-axis direction side) and placed on a lifting and lowering mechanism 10 that is reciprocably movable in Z-axis directions, i.e., +Z-axis and −Z-axis directions. The wafer cassette 11 houses a plurality of wafers such as semiconductor wafers or the like therein. The cutting apparatus 1 also includes loading/unloading means 12 for loading a wafer into and unloading a wafer from the wafer cassette 11, the loading/unloading means 12 being disposed rearwardly of (+Y-axis direction side) the wafer cassette 11. A temporary storage area 13 for temporarily holding a wafer to be loaded or unloaded is provided between the wafer cassette 11 and the loading/unloading means 12. Positioning means 14 for positioning a wafer in alignment with a certain position is disposed in the temporary storage area 13.

First delivery means 15a for delivering a wafer between the chuck table 30 and the temporary storage area 13 is disposed near the temporary storage area 13. The first delivery means 15a attracts a wafer and delivers the wafer from the temporary storage area 13 to the chuck table 30.

Cleaning means 16 for cleaning a wafer that has been cut is disposed near the first delivery means 15a. Second delivery means 15b for attracting and delivering a wafer that has been cut, from the chuck table 30 to the cleaning means 16 is disposed above the cleaning means 16. The cutting apparatus 1 further includes input means 19 on the front side thereof for inputting processing conditions entered by the operator into the cutting apparatus 1.

The chuck table 30 is of a circular profile, for example, and has a holding surface 30a held in fluid communication with a suction source, not shown, for holding a wafer under suction thereon. The chuck table 30 is surrounded by a cover 31 disposed therearound, and is rotatably supported by rotating means, not shown.

The chuck table 30 is reciprocably movable in X-axis directions, i.e., +X-axis and −X-axis directions, between a mounting and dismounting area E1 where a wafer is mounted on and dismounted from the chuck table 30 and a cutting area E2 where a wafer held on the chuck table 30 is cut by the cutting means 6, by cutting-feed means, not shown, disposed below the cover 31 and a bellows cover 31a coupled to the cover 31.

Alignment means 17 for detecting a projected dicing line on a wafer on the chuck table 30, along which to cut the wafer, is disposed above the path along which the chuck table 30 is movable. The alignment means 17 includes image capturing means 170 for capturing an image of a surface of the wafer on the chuck table 30. The alignment means 17 detects a projected dicing line on the wafer based on the image captured by the image capturing means 170.

The cutting means 6 for cutting a wafer held on the chuck table 30 in the cutting area E2 is disposed near the alignment means 17. The cutting means 6 is integrally combined with the alignment means 17, so that the cutting means 6 and the alignment means 17 are movable in unison with each other in the Y-axis directions and the Z-axis directions.

Figure 2:
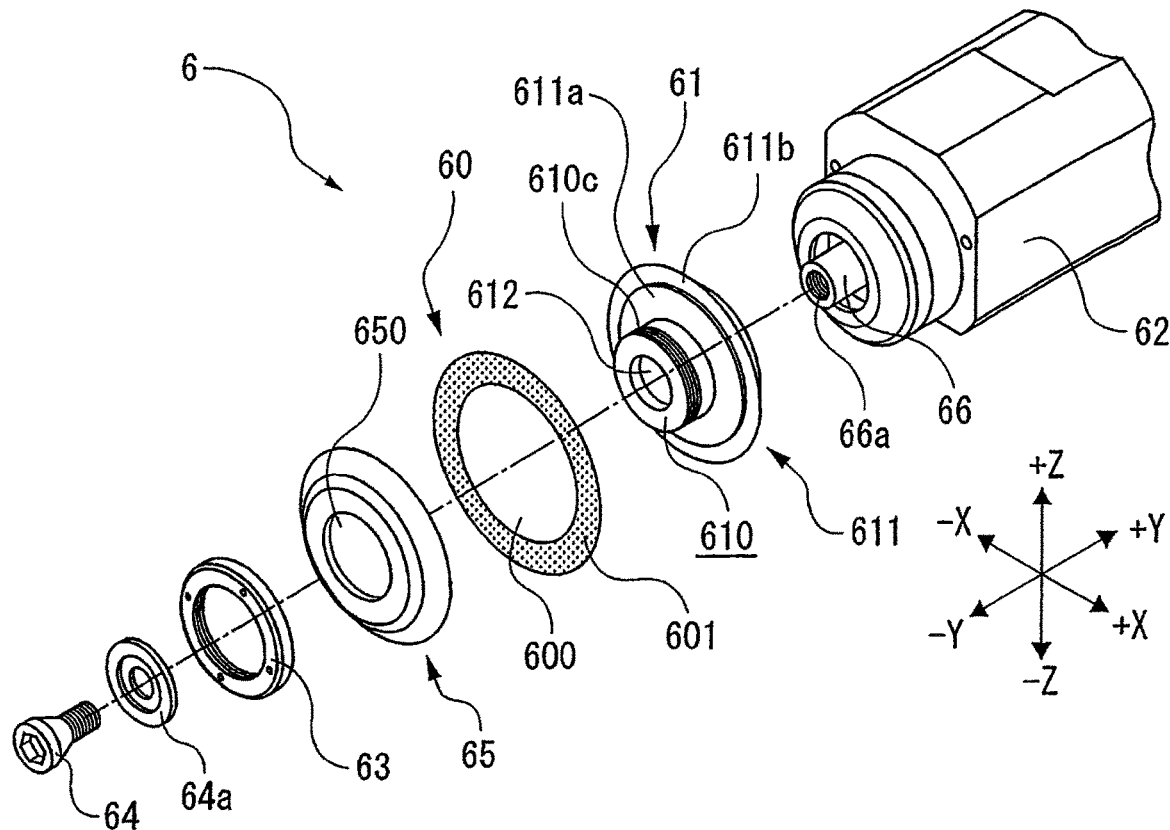
FIG. 2 is an exploded perspective view of cutting means.
Figure 3:
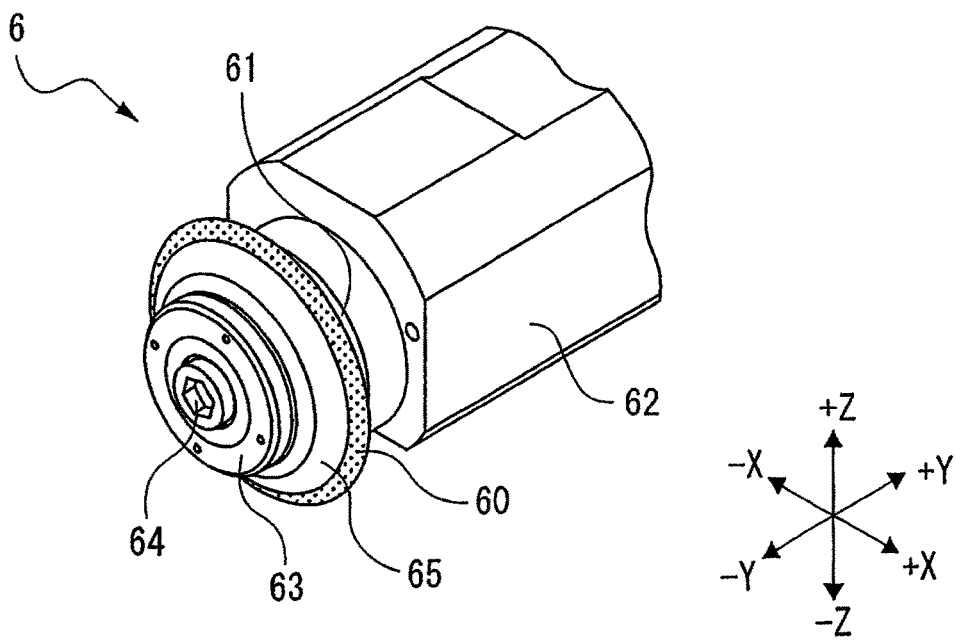
FIG. 3 is a perspective view of the cutting means.

FIG. 2 shows the cutting means 6 in exploded perspective, and FIG. 3 shows the cutting means 6 in perspective. The cutting means 6 shown in FIG. 2 includes a washer-type hubless blade 60 having an annular profile, for example. The blade 60 has a mount hole 600 defined centrally therein and a cutting edge 601 extending around the mount hole 600.

The cutting means 6 also includes a spindle housing 62 in which a spindle 66 having a central axis along the Y-axis directions and rotatable about the central axis by an electric motor, not shown, is rotatably housed. The spindle 66 has a distal end projecting forwardly in the −Y-axis direction from the spindle housing 62, with a flange 61 being fixedly mounted on the projecting distal end. The projecting distal end of the spindle 66 has an internally threaded hole 66a defined therein.

The flange 61 that is fixedly mounted on the projecting distal end of the spindle 66 has a boss 610 projecting axially to a predetermined thickness in the −Y-axis direction and a flange member 611 projecting radially outwardly from the rear end of the boss 610. The boss 610 is smaller in diameter than the flange member 611, and has an externally threaded outer side surface 610c.

The flange member 611 has a blade mount 611a projecting in the −Y-axis direction on a front surface thereof that faces in the −Y-axis direction. The blade 60 is fitted over and mounted on the blade mount 611a. The blade mount 611a on the front surface of the flange member 611 provides an annular higher step on the flange member 611. The flange member 611 includes an outer peripheral annular end face 611b lying as a lower step around the blade mount 611a on the front surface of the flange member 611. The annular end face 611b serves as a face for supporting the blade 60 thereon. The annular end face 611b has a width whose magnitude depends on the diameter, etc. of the blade 60. The outside diameter of the blade mount 611a is slightly smaller than the diameter of the mount hole 600 in the blade 60.

The flange 61 has a fitting hole 612 defined centrally therein for being fitted over the spindle 66 and extending through the flange 61 in the thicknesswise directions thereof, i.e., in the Y-axis directions.

The cutting means 6 further includes a holder 65 that cooperates with the flange 61 in gripping and securing the blade 60 in position. The holder 65 includes a mounting and dismounting flange that is of an annular profile and has a central hole 650 defined therein for receiving of the boss 610 inserted therethrough.

The flange 61 is mounted on the spindle 66 by inserting the spindle 66 into the fitting hole 612 in the flange 61 and then threading a flange fixing bolt 64 that has been inserted through a plain washer 64a into the internally threaded hole 66a in the spindle 66. Then, the blade 60 is fitted over the blade mount 611a of the flange 61 with the boss 610 inserted in the mount hole 600 in the blade 60, whereupon the boss 610 projects from the blade 60 in the −Y-axis direction. Then, the holder 65 is fitted over the boss 610 which projects through the central hole 650 in the holder 65, and a blade fixing nut 63 is threaded over the externally threaded outer side surface 610c of the boss 610 and tightened against the holder 65, thereby gripping and securing the blade 60 in position between the rear face of the holder 65, i.e., the face that faces in the +Y-axis direction, and the annular end face 611b of the flange member 611 of the flange 61. The blade 60 is now fixedly mounted on the spindle 66, i.e., the cutting means 6 is assembled, as shown in FIG. 3. The blade 60 can be rotated at a high speed about its own axis when the spindle 66 (not shown in FIG. 3) is rotated by the electric motor, not shown.

The cutting means 6 as assembled as shown in FIG. 3 is provided in the cutting apparatus 1 shown in FIG. 1. A blade cover, not shown, is attached to the spindle housing 62 in overhanging relation to the blade 60.

The blade 60 of the cutting means 6 is not limited to a washer-type hubless blade, but may be a hub blade including an aluminum base and an annular cutting edge disposed on and around an outer peripheral edge of the aluminum base. If the blade 60 is a hub blade, then the blade fixing nut 63 shown in FIG. 2 serves as a holder that cooperates with the flange 61 in gripping and securing the blade 60 in position.

(Blade Mounting and Dismounting Jig According to Embodiment 1)

Figure 4:
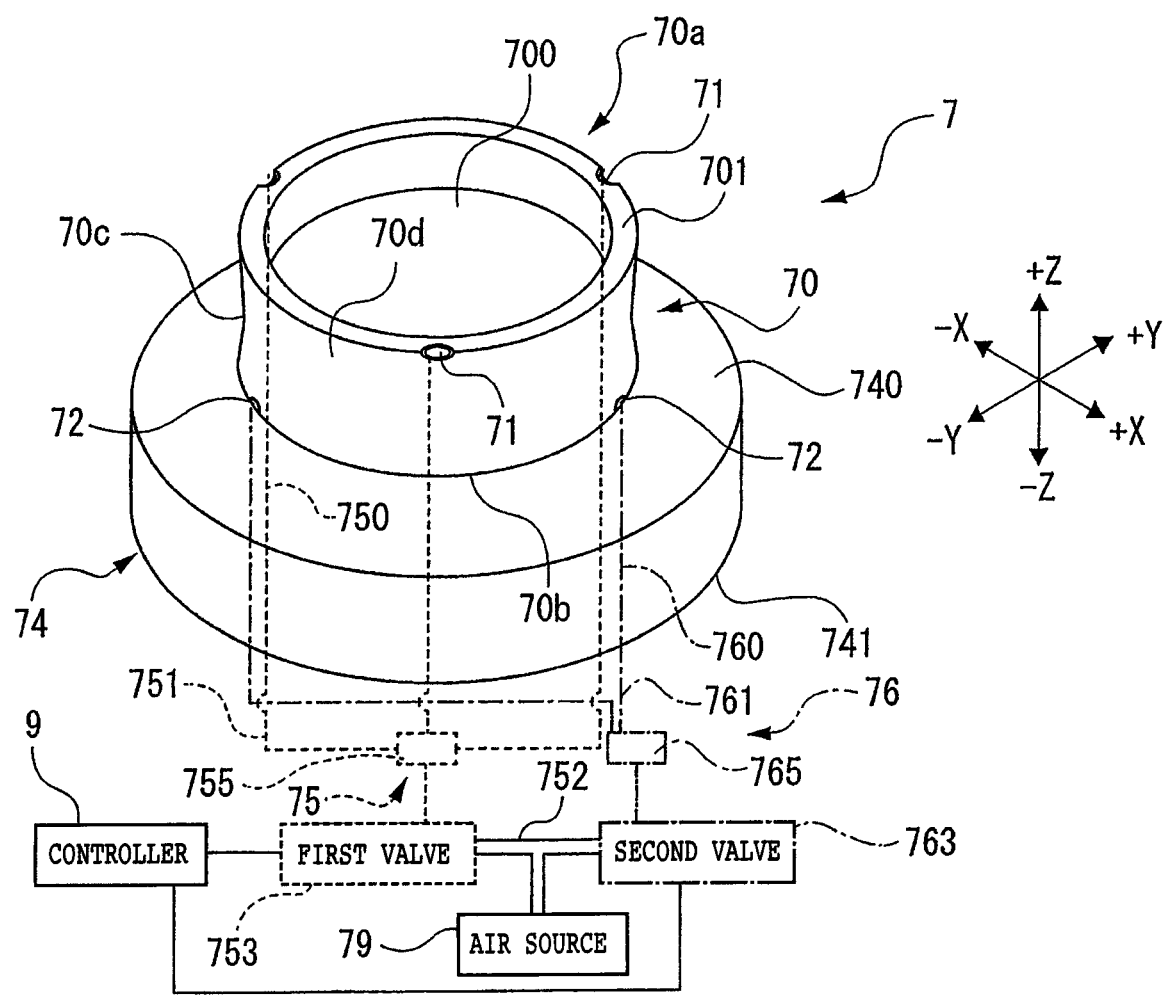
FIG. 4 is a perspective view of a blade mounting and dismounting jig, showing an outer profile thereof by way of example.

FIG. 4 shows in perspective a blade mounting and dismounting jig 7 that serves as a jig to be used for mounting the blade 60 on the flange 61 shown in FIG. 2 or dismounting the blade 60 from the flange 61. As shown in FIG. 4, the blade mounting and dismounting jig 7 includes at least: a cylindrical jig body 70 having a recess 700 defined in a distal end portion 70a thereof which is of the same diameter as the blade mount 611a shown in FIG. 2, the recess 700 being receptive of the boss 610 fitted therein; a grip 74 joined to the jig body 70 and having a diameter larger than the jig body 70; a plurality of first air ejection ports 71 defined in the distal end portion 70a of the jig body 70 (and the grip 74); a plurality of second air ejection ports 72 defined in the jig body 70 at the juncture between the jig body 70 and the grip 74; a first fluid communication route 75 for bringing the first air ejection ports 71 into fluid communication with an air source 79 under the control of a controller 9; and a second fluid communication route 76 for bringing the second air ejection ports 72 into fluid communication with the air source 79 under the control of the controller 9.

The jig body 70, which is of a cylindrical profile, is made of engineering plastics, hard rubber, or the like, for example. The jig body 70 may have a constriction 70c with a reduced diameter at an intermediate position in the thicknesswise directions thereof, i.e., the Z-axis directions in FIG. 4. The jig body 70 may be dispensed with the constriction 70c. The diameter of the constriction 70c is set to an appropriate value depending on the diameter of the mount hole 600 in the blade 60.

The recess 700 is defined as a cylindrical space in a central area of the distal end portion 70a thereof, extending in the thicknesswise directions of the jig body 70. The diameter of the recess 700 is slightly larger than the diameter of the boss 610 shown in FIG. 2. The distal end portion 70a is of a shape surrounding the recess 700, i.e., is shaped as an annular wall. The recess 700 has a depth large enough for the boss 610 to be inserted therein up to the base of the boss 610, for example. However, the recess 700 may not necessarily have such a depth.

The first air ejection ports 71 include three first air ejection ports, for example, defined in the distal end portion 70a and circumferentially spaced at equal angular intervals of 120°. The first air ejection ports 71 are open in both an annular end face 701 of the distal end portion 70a and a side face 70d of the jig body 70, or stated otherwise, are open across the outer ridge of the distal end portion 70a. The first air ejection ports 71 are not limited to three first air ejection ports, but may include four first air ejection ports.

The grip 74 that is larger in diameter than the jig body 70 has a front surface 740 joined to a rear end 70b of the jig body 70. The grip 74 is in the shape of a disk made of engineering plastics, hard rubber, or the like, for example. According to the present embodiment, the grip 74 is integrally formed with the jig body 70. However, the grip 74 may be detachably fastened to the rear end 70b of the jig body 70 by mounting screws or the like, not shown, or may be bonded to the rear end 70b of the jig body 70 by an adhesive. When the operator mounts the blade 60 on or dismounts the blade 60 from the flange 61 using the blade mounting and dismounting jig 7, the operator can handle the blade mounting and dismounting jig 7 with ease by gripping the grip 74.

The second air ejection ports 72 include three second air ejection ports (two shown in FIG. 4), for example, defined in the jig body 70 (and the grip 74) at the juncture between the jig body 70 and the grip 74 and circumferentially spaced at equal angular intervals of 120°. The second air ejection ports 72 are circumferentially positioned out of axial alignment with the first air ejection ports 71. The second air ejection ports 72 are not limited to three second air ejection ports, but may include four second air ejection ports. The second air ejection ports 72 are open at the base of the side face 70d of the jig body 70, and are capable of ejecting compressed air radially outwardly of the jig body 70.

Figure 5:
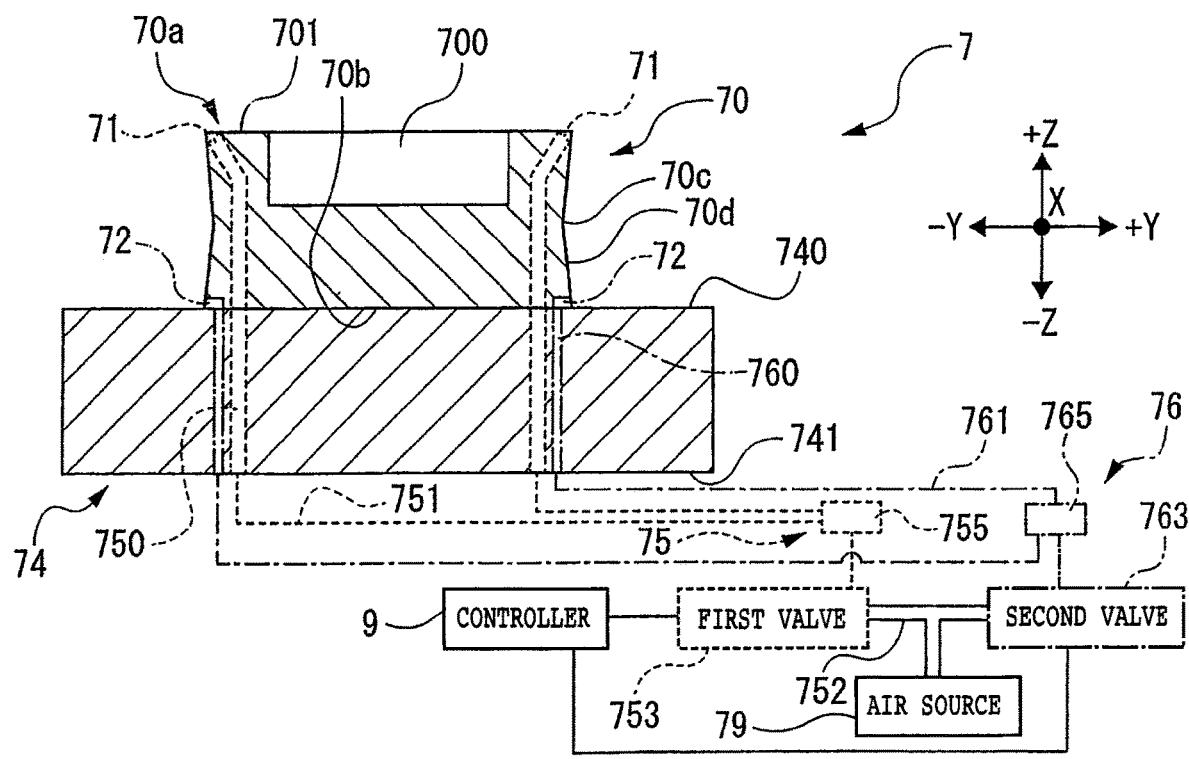
FIG. 5 is a cross-sectional view of the blade mounting and dismounting jig, showing its structure by way of example.

As shown in FIGS. 4 and 5, inner passageways 750, indicated by dotted lines, extend respectively from the first air ejection ports 71 axially through the jig body 70 to the rear end 70b thereof and then extend from the rear end 70b axially through the grip 74 to a rear surface 741 thereof where the inner passageways 750 have respective ends open.

To the ends of the inner passageways 750 which are open at the rear surface 741 of the grip 74, there are connected respective ends of resin tubes 751 having flexibility through seal members, couplings, or the like, not shown, so that the resin tubes 751 are held in fluid communication with the inner passageways 750.

The resin tubes 751 have respective opposite ends joined together by a joint tube 755 that is connected to a first valve 753 on a branch of a T-shaped pipe 752. Another branch of the T-shaped pipe 752 is connected to an air source 79 such as a compressor or the like for supplying compressed air under high pressure. The first fluid communication route 75 is made up of the inner passageways 750, the resin tubes 751, the first valve 753, and the T-shaped pipe 752. The first fluid communication route 75 may include an orifice or the like for accelerating air that flows through the first fluid communication route 75. The first valve 753 includes, for example, a solenoid(electromagnet)-operated valve that can be selectively opened and closed to bring the resin tubes 751 into and out of fluid communication with the T-shaped pipe 752. The first valve 753 is electrically connected to the controller 9 that selectively energizes and de-energizes the solenoid of the first valve 753 to open and close the first valve 753. The first valve 753 is not limited to a solenoid-operated valve, but may be a button-operated on/off valve that can be opened when its button is pressed.

Inner passageways 760, indicated by dot-and-dash lines, extend respectively from the second air ejection ports 72 axially through the grip 74 to the rear surface 741 thereof where the inner passageways 760 have respective ends open. To the ends of the inner passageways 760, there are connected respective ends of resin tubes 761 having flexibility through seal members, couplings, or the like, not shown, so that the resin tubes 761 are held in fluid communication with the inner passageways 760.

The resin tubes 761 have respective opposite ends joined together by a joint tube 765 that is connected to a second valve 763 on a branch of the T-shaped pipe 752. The second fluid communication route 76 is made up of the inner passageways 760, the resin tubes 761, the second valve 763, and the T-shaped pipe 752. The second fluid communication route 76 may include an orifice or the like for accelerating air that flows through the second fluid communication route 76. The second valve 763 includes, for example, a solenoid (electromagnet)-operated valve that can be selectively opened and closed to bring the resin tubes 761 into and out of fluid communication with the T-shaped pipe 752. The second valve 763 is electrically connected to the controller 9 that selectively energizes and de-energizes the solenoid of the second valve 763 to open and close the second valve 763. The second valve 763 is not limited to a solenoid-operated valve, but may be a button-operated on/off valve that can be opened when its button is pressed.

(Mounting the Blade on the Flange Using the Blade Mounting and Dismounting Jig According to Embodiment 1)

Steps of a blade mounting and dismounting method according to Embodiment 1 for mounting the blade 60 on the flange 61 using the blade mounting and dismounting jig 7 shown in FIG. 6 will be described in detail below.

(1) Positioning Step

Figure 6:
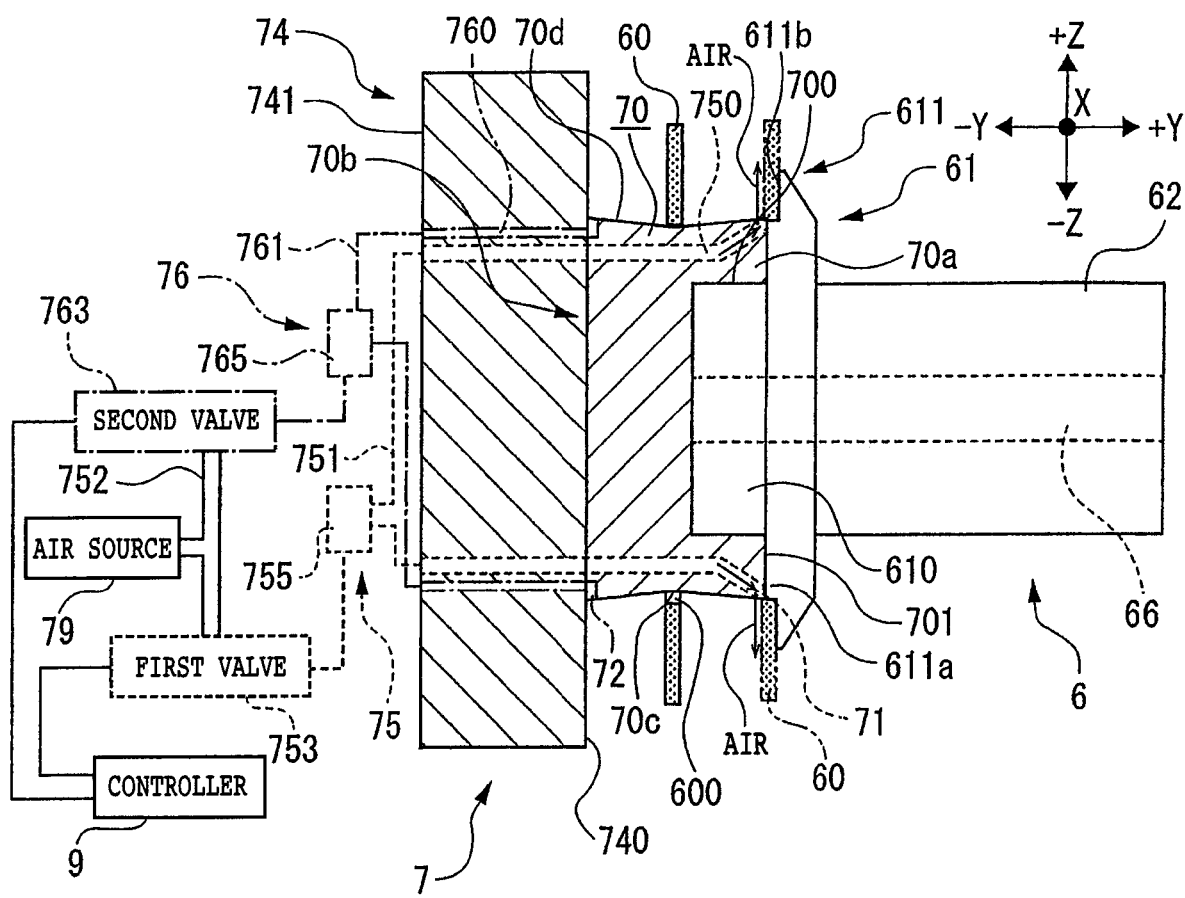
FIG. 6 is a cross-sectional view showing the manner in which a blade is mounted on a flange using the blade mounting and dismounting jig.

The cutting means 6 shown in FIG. 6 has the flange 61 mounted on the spindle 66. The jig body 70 of the blade mounting and dismounting jig 7 is inserted in the mount hole 600 in the blade 60, which is held on the blade mounting and dismounting jig 7 while being movable on the side face 70d of the jig body 70. There is a small clearance or play between the side face 70d of the jig body 70 and the edge of the blade 60 which edge defines the mount hole 600. The operator grips the grip 74 of the blade mounting and dismounting jig 7, and positions the blade mounting and dismounting jig 7 such that the distal end portion 70a faces the flange 61. The operator moves the blade mounting and dismounting jig 7 toward the flange 61 to cause the boss 610 of the flange 61 to fit into the recess 700 in the blade mounting and dismounting jig 7 until the jig body 70 is coupled to the blade mount 611a and positioned coaxially with the flange 61. Since the distal end portion 70a of the jig body 70 and the blade mount 611a are of the same diameter, the distal end portion 70a of the jig body 70 and the blade mount 611a have respective side faces joined smoothly together, providing a continuous side face free of steps or surface irregularities.

(2) Mounting Air Ejecting Step

Then, the air source 79 is able to supply air to the first air ejection ports 71 through the first fluid communication route 75 under the control of the controller 9. Specifically, the controller 9 energizes the solenoid of the first valve 753 to open the first valve 753. The controller 9 keeps the second valve 763 closed. The controller 9 actuates the air source 79 to supply compressed air under high pressure to the T-shaped pipe 752 for a short period of time. The compressed air flows through the T-shaped pipe 752, the first valve 753, the resin tubes 751, and the inner passageways 750, and is instantaneously ejected out of the first air ejection ports 71.

If the first valve 753 includes a button-operated on/off valve, then instead of the controller 9 controlling the first valve 753, the operator may press the button to open the first valve 753.

(3) Moving Step

The air that is instantaneously ejected out of the first air ejection ports 71 flows at a high speed radially outwardly between the annular end face 611b of the flange member 611 and the side face of the blade 60 that faces in the +Y-axis direction, and is discharged into the atmosphere. The air flow produces a negative pressure tending to attract the blade 60 in the +Y-axis direction due to the Bernoulli's effect, moving under the negative pressure the blade 60 away from the blade mounting and dismounting jig 7 toward the blade mount 611a until the blade 60 is fitted over the blade mount 611a. In FIG. 6, the blade 60 that has moved to the blade mount 611a is indicated by the two-dot-and-dash lines.

As described above, for mounting the blade 60 held on the jig body 70 on the flange 61, the blade mounting and dismounting method according to the present invention includes: the positioning step of causing the boss 610 to fit into the recess 700 in the jig body 70 of the blade mounting and dismounting jig 7 to couple the jig body 70 and the blade mount 611a to each other and position them coaxially with each other; the mounting air ejecting step of instantaneously ejecting air from the first air ejection ports 71; and the moving step of moving the blade 60 to the blade mount 611a under a negative pressure produced between the blade 60 and the flange 61. Therefore, the blade mounting and dismounting method makes it possible to mount the blade 60 on the flange 61 under a negative pressure in a contactless fashion without the operator directly touching the blade 60.

After the blade 60 has moved to the blade mount 611a, the operator grips the grip 74 and pulls the blade mounting and dismounting jig 7 away from the boss 610 in the −Y-axis direction. The operator then fits the holder 65 shown in FIG. 2 over the boss 610, and threads the blade fixing nut 63 over the externally threaded outer side surface 610c of the boss 610 and tightens the blade fixing nut 63. The blade 60 thus mounted on the flange 61 can be rotated at a high speed about its own axis when the spindle 66 is rotated by the electric motor, not shown.

(Dismounting the Blade from the Flange Using the Blade Mounting and Dismounting Jig According to Embodiment 1)

Steps of the blade mounting and dismounting method according to Embodiment 1 for dismounting the blade 60 from the flange 61 using the blade mounting and dismounting jig 7 shown in FIG. 7 will be described in detail below.

(1) Positioning Step

Figure 7:
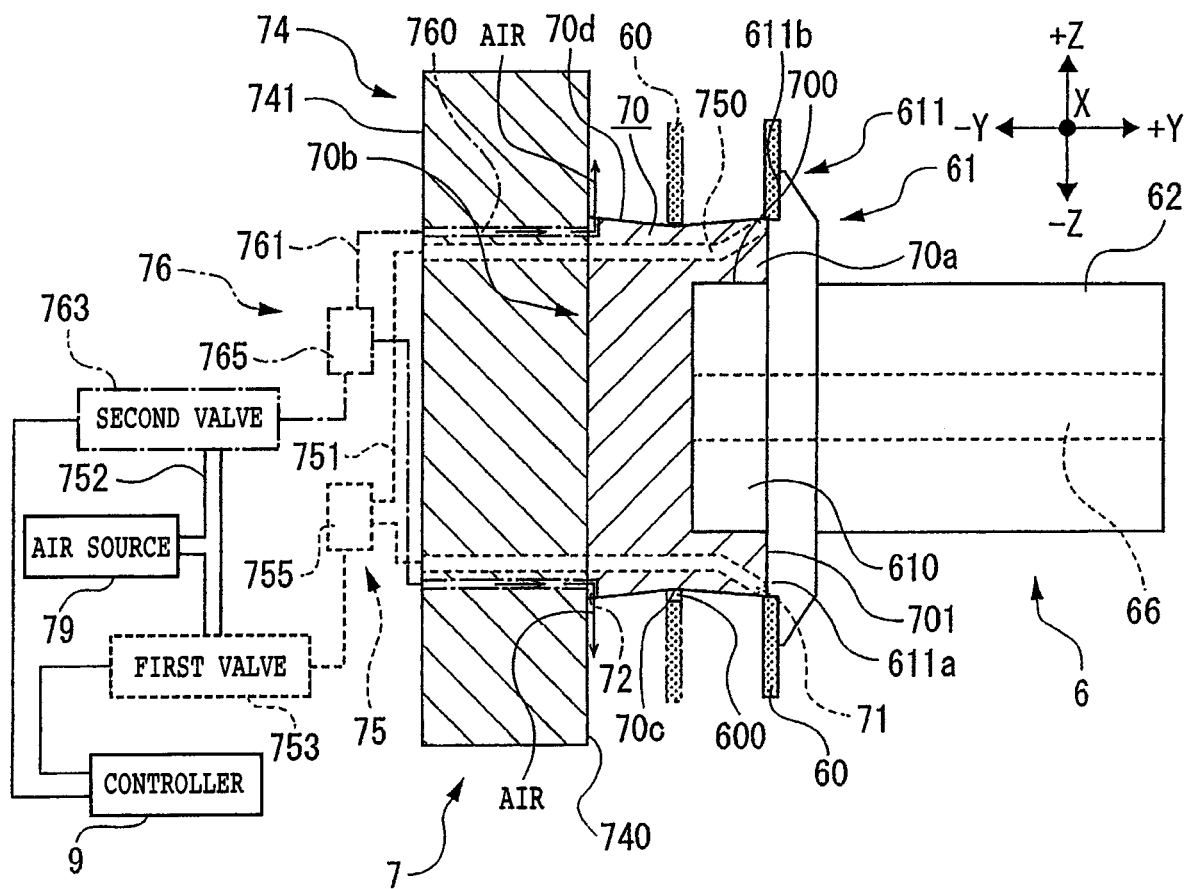
FIG. 7 is a cross-sectional view showing the manner in which the blade is dismounted from the flange using the blade mounting and dismounting jig.

The cutting means 6 shown in FIG. 7 is free of the holder 65 and the blade fixing nut 63 shown in FIG. 2 and has the blade 60 fitted over the blade mount 611a. The operator grips the grip 74 of the blade mounting and dismounting jig 7, and positions the blade mounting and dismounting jig 7 such that the distal end portion 70a faces the flange 61. The operator moves the blade mounting and dismounting jig 7 toward the flange 61 to cause the boss 610 of the flange 61 to fit into the recess 700 in the blade mounting and dismounting jig 7 until the jig body 70 is coupled to the blade mount 611a and positioned coaxially with the flange 61 along the Y-axis directions.

(2) Dismounting Air Ejecting Step

Then, the air source 79 is able to supply air to the second air ejection ports 72 through the second fluid communication route 76 under the control of the controller 9. Specifically, the controller 9 energizes the solenoid of the second valve 763 to open the second valve 763. The controller 9 keeps the first valve 753 closed. The controller 9 actuates the air source 79 to supply compressed air under high pressure to the T-shaped pipe 752 for a short period of time. The compressed air flows through the T-shaped pipe 752, the second valve 763, the resin tubes 761, and the inner passageways 760, and is instantaneously ejected out of the second air ejection ports 72.

If the second valve 763 includes a button-operated on/off valve, then instead of the controller 9 controlling the second valve 763, the operator may press the button to open the second valve 763.

(3) Moving Step

The air that is instantaneously ejected out of the second air ejection ports 72 flows at a high speed radially outwardly between the side face of the blade 60 that faces in the −Y-axis direction and the front face 740 of the grip 74, and is discharged into the atmosphere. The air flow produces a negative pressure tending to attract the blade 60 in the −Y-axis direction due to the Bernoulli's effect, moving under the negative pressure the blade 60 away from the blade mount 611a toward the jig body 70 of the blade mounting and dismounting jig 7 until the blade 60 is removed from the blade mount 611a. In FIG. 7, the blade 60 that has moved to the jig body 70 is indicated by the two-dot-and-dash lines.

As described above, for dismounting the blade 60 held on the flange 61 from the flange 61, the blade mounting and dismounting method according to the present invention includes: the positioning step of causing the boss 610 to fit into the recess 700 in the jig body 70 of the blade mounting and dismounting jig 7 to couple the jig body 70 and the blade mount 611a to each other and position them coaxially with each other; the dismounting air ejecting step of instantaneously ejecting air from the second air ejection ports 72; and the moving step of moving the blade 60 to the jig body 70 under a negative pressure produced between the blade 60 and the grip 74. Therefore, the blade 60 can be dismounted from the flange 61 under a negative pressure in a contactless fashion without the operator directly touching the blade 60.

The blade mounting and dismounting jig 7 according to the present invention includes at least: the cylindrical jig body 70 having the recess 700 defined in the distal end portion 70a thereof which is of the same diameter as the blade mount 611a, the recess 700 being receptive of the boss 610 fitted therein; the grip 74 joined to the jig body 70 and having the diameter larger than the jig body 70, the plurality of first air ejection ports 71 defined in the distal end portion 70a of the jig body 70, the plurality of second air ejection ports 72 defined in the jig body 70 (and the grip 74) at the juncture between the jig body 70 and the grip 74; the first fluid communication route 75 for bringing the first air ejection ports 71 into fluid communication with the air source 79 under the control of the controller 9; and the second fluid communication route 76 for bringing the second air ejection ports 72 into fluid communication with the air source 79 under the control of the controller 9. Since the blade mounting and dismounting jig 7 allows the blade 60 to be mounted on the flange 61 in a contactless fashion under a negative pressure produced by air ejected from the first air ejection ports 71 based on the Bernoulli's theorem and also allows the blade 60 to be dismounted from the flange 61 in a contactless fashion under a negative pressure produced by air ejected from the second air ejection ports 72 based on the Bernoulli's theorem, the operator may stay out of direct touch with the blade 60 in mounting and dismounting the blade 60. In addition, as the blade 60 can be mounted and dismounted without forces concentrating on any spot thereof, the blade 60 is prevented from being broken.

Though the blade mounting and dismounting jig 7 according to the present embodiment is configured to be used in mounting and dismounting the blade 60 as a hubless blade, it may be configured for use in mounting and dismounting a hub blade.

Since the jig body 70 has the constriction 70c as shown in FIG. 6, play is created between the constriction 70c and the blade 60 when the blade 60 is mounted on and dismounted from the flange 61. Therefore, when the blade 60 is moved on the side face 70d of the jig body 70 under a negative pressure in a process of mounting the blade 60 on the flange 61, for example, the blade 60 is prevented from being caught and held immovable by the jig body 70 due to the side surfaces of the blade 60 being tilted with respect to the direction, i.e., +Y-axis direction, along which the blade 60 is moved.

Figure 8:
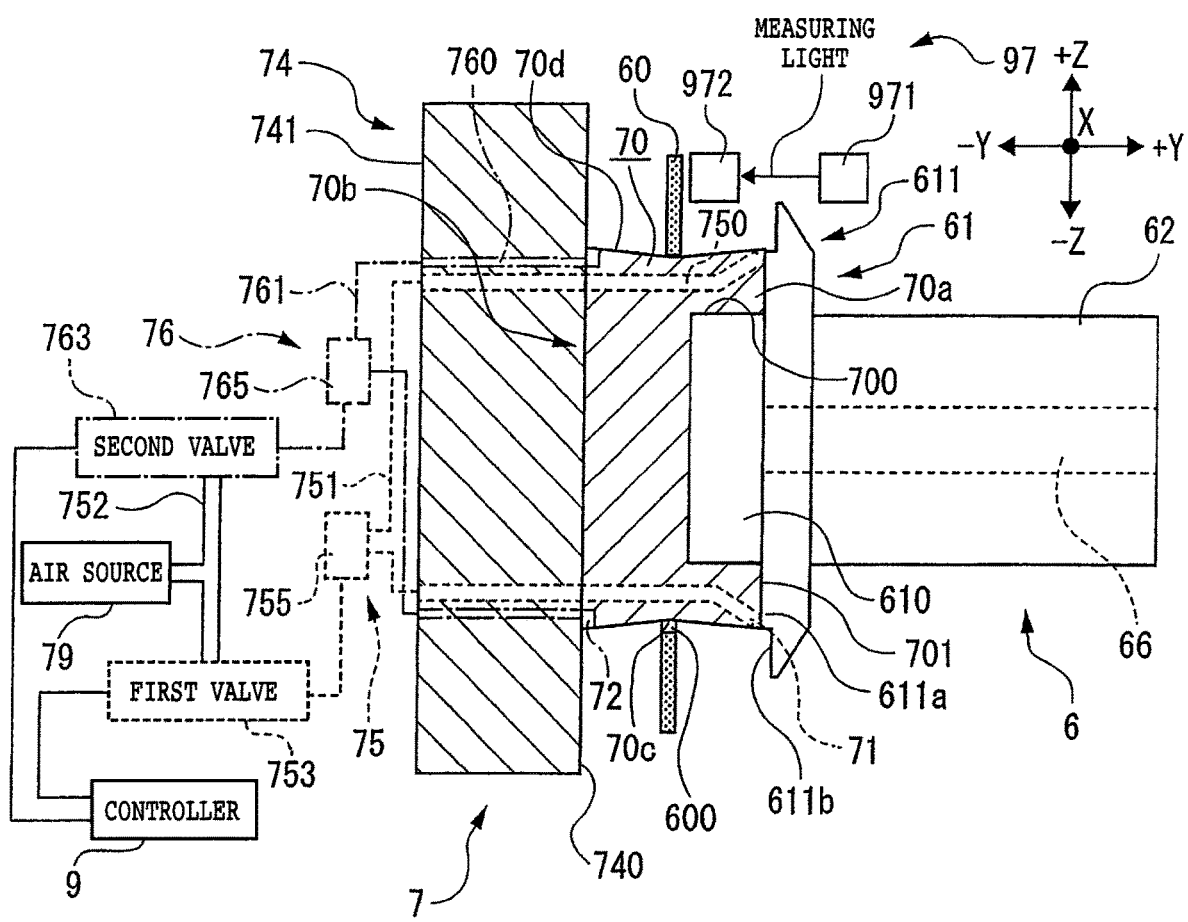
FIG. 8 is a cross-sectional view showing the manner in which an optical sensor connected to a controller operates when no blade is mounted on the flange.
Figure 9:
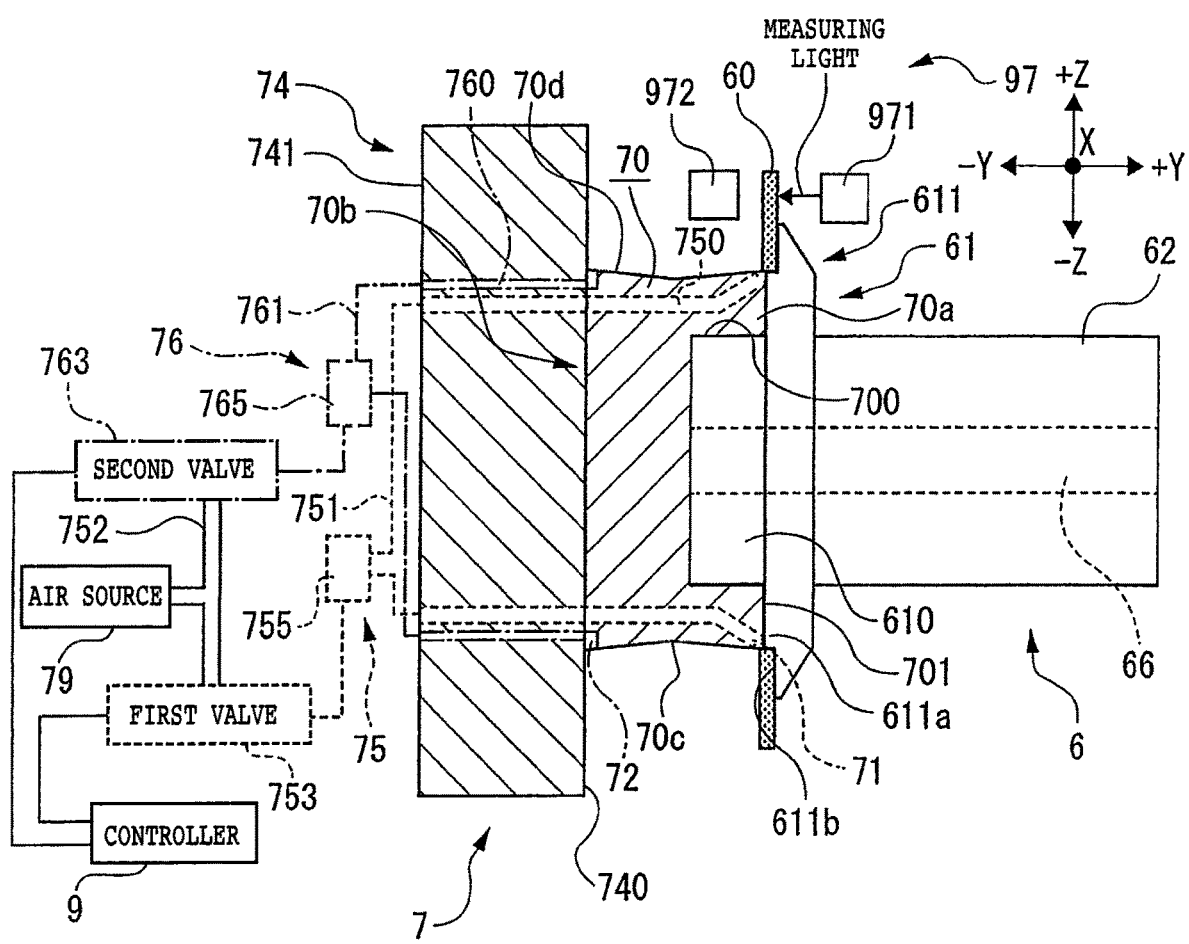
FIG. 9 is a cross-sectional view showing the manner in which the optical sensor connected to the controller operates when the blade is mounted on the flange.

The controller 9 may control the first and second valves 753 and 756 to open and close the first fluid communication route 75 and the second fluid communication route 76 in combination with an optical sensor 97 shown in FIG. 8. The optical sensor 97 includes a transmissive optical sensor that is electrically connected to the controller 9 by wiring, not shown, and is disposed on the blade cover that covers the blade 60 of the cutting means 6 shown in FIG. 1. The optical sensor 97 also operates as a blade fracture detector for detecting a blade fracture, for example, and includes a light emitter 971 for emitting measuring light and a light detector 972 for detecting measuring light. When the blade 60 is not mounted on the flange 61 as shown in FIG. 8, measuring light emitted from the light emitter 971 travels straight in the −Y-axis direction, for example, and reaches the light detector 972. On the other hand, when the blade 60 is mounted on the flange 61 as shown in FIG. 9, measuring light emitted from the light emitter 971 is interrupted partly or wholly by the blade 60 and does not reach the light detector 972.

The light detector 972, which senses whether the blade 60 has interrupted measuring light or not, outputs a detected signal representing an amount of detected light to the controller 9. The controller 9 has a threshold value preset therein about an amount of detected light, i.e., a threshold value for deciding whether the blade 60 has been mounted on the flange 61 or not. Based on comparison between a value representing an amount of detected light sent from the light detector 972 and the threshold value, the controller 9 selectively performs a control process for opening the first valve 753 and closing the second valve 763 when the value representing the amount of detected light is larger than the threshold value and a control process for closing the first valve 753 and opening the second valve 763 when the value representing the amount of detected light is smaller than the threshold value.

As shown in FIG. 8, when the blade 60 is not mounted on the flange 61, since measuring light is not interrupted by the blade 60 and a large amount of light is detected by the light detector 972, the controller 9 opens the first valve 753 and closes the second valve 763, allowing air supplied from the air source 79 to flow through the first fluid communication route 75 to the first air ejection ports 71. In the (1) positioning step for mounting the blade 60 on the flange 61 as described above, this control process is automatically carried out for increased working efficiency.

Inasmuch as the amount of light detected by the light detector 972 is reduced upon the blade 60 being mounted on the flange 61, the controller 9 decides that the blade 60 is mounted on the flange 61 on account of the change in the amount of light detected by the light detector 972, and closes the first valve 753. The control process thus carried out by the controller 9 based on the change in the amount of detected light makes it possible to simultaneously control the time during which to supply air to be ejected to the first air ejection ports 71.

As shown in FIG. 9, when the blade 60 is mounted on the flange 61, since measuring light is interrupted by the blade 60 and a very small amount of light is detected by the light detector 972, the controller 9 closes the first valve 753 and opens the second valve 763, allowing air supplied from the air source 79 to flow through the second fluid communication route 76 to the second air ejection ports 72. In the (1) positioning step for dismounting the blade 60 from the flange 61 as described above, this control process is automatically carried out for increased working efficiency.

Inasmuch as the amount of light detected by the light detector 972 is increased upon the blade 60 being dismounted from the flange 61, the controller 9 decides that the blade 60 is dismounted from the flange 61 on account of the change in the amount of light detected by the light detector 972, and closes the second valve 763. The control process thus carried out by the controller 9 based on the change in the amount of detected light makes it possible to simultaneously control the time during which to supply air to be ejected to the second air ejection ports 72.

(Blade Mounting and Dismounting Jig According to Embodiment 2)

Figure 10:
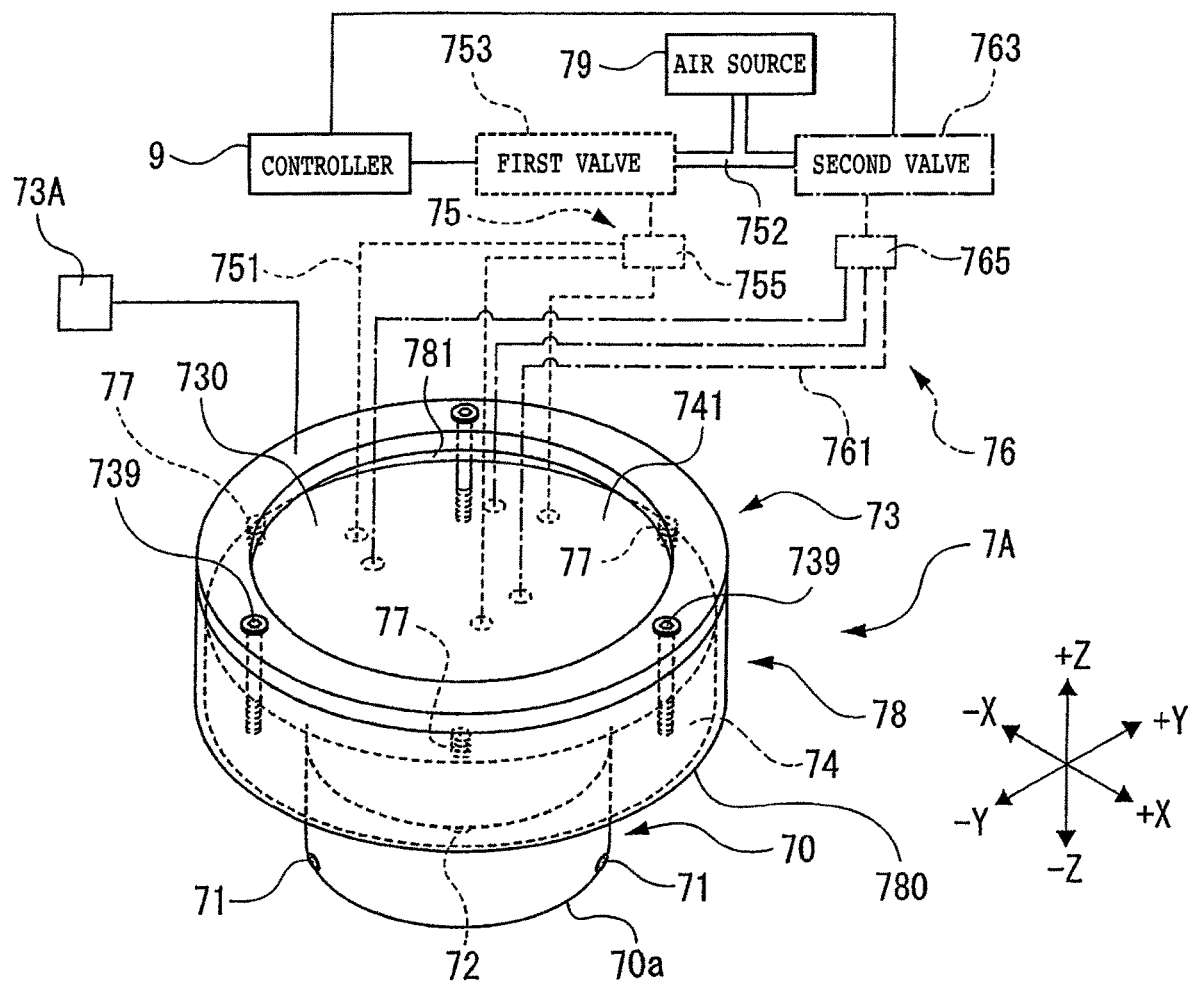
FIG. 10 is a perspective view of a blade mounting and dismounting jig that is provided with an air guide member.

FIG. 10 shows a blade mounting and dismounting jig 7A includes the blade mounting and dismounting jig 7 according to Embodiment 1 shown in FIG. 4, an air guide member (air guide means) 78 having at least an air guide surface 781 that can be positioned in the direction of travel of air ejected radially outwardly from the second air ejection ports 72, an auxiliary plate 73 that supports the air guide member 78, and a plurality of (three in FIG. 10) resilient members 77 that allow the air guide member 78 to move back and forth in the thicknesswise directions of the jig body 70, i.e., in the Z-axis directions in FIG. 10.

The auxiliary plate 73, which is made of engineering plastics or the like, is shaped as an annular plate having an outside diameter slightly larger than the diameter of the grip 74, for example, and fastened to the rear surface 741 of the grip 74 by a plurality of (three in FIG. 10) mounting screws 739. The operator can handle the blade mounting and dismounting jig 7A that includes the air guide member 78 by gripping the auxiliary plate 73 attached to the grip 74 or the air guide member 78. The auxiliary plate 73 has a central opening 730 defined therein through which the resin tubes 751 and 761 connected to the rear surface 741 of the grip 74 extend. The auxiliary plate 73 has a plurality of (three in FIG. 10) mounting screw insertion holes defined therein and circumferentially spaced at equal angular intervals of 120°. The mounting screws 739 have respective externally threaded lower portions threaded into respective internally threaded holes, not shown, defined in the rear surface 741 of the grip 74, for example, and also have respective upper portions extending from longitudinally central regions to screw heads and projecting upwardly from the rear surface 741 of the grip 74. The upper portions of the mounting screws 739 are loosely fitted in the respective mounting screw insertion holes defined in the auxiliary plate 73. A predetermined gap is provided between the auxiliary plate 73 and the grip 74.

The resilient members 77 include helical springs, respectively, for example, that tend to return resiliently when compressed from their free state. The resilient members 77 are disposed in the gap between the lower surface of the auxiliary plate 73 and the rear face 741 of the grip 74 and circumferentially spaced at equal angular intervals of 120°.

The resilient members 77 are not limited to helical springs, but may include rubber columns or the like, for example. As shown in FIG. 10, when the auxiliary plate 73 is not pressed toward the grip 74, the resilient members 77 are of their natural length.

The air guide member 78 is molded to a hollow cylindrical shape of a synthetic resin such as polyacetal (POM) or the like, and has an inner side surface serving as the air guide surface 781. The air guide member 78 is fitted in and fixed to the auxiliary member 73 by an adhesive or the like. As shown in FIG. 10, the air guide member 78 that is fixed to the auxiliary member 73 skirts around the grip 74 and hangs to a predetermined length in the −Z-axis direction from the outer peripheral edge of the auxiliary plate 73. When the auxiliary plate 73 is not pressed toward the grip 74 and the resilient members 77 are of their natural length, the air guide member 78 has a distal end 780 (lower end in FIG. 10) positioned short of the second air ejection ports 72 of the jig body 70 in the +Z-axis direction, and hence does not surround the side face 70*d* and the second air ejection ports 72 of the jig body 70.

Figure 12:
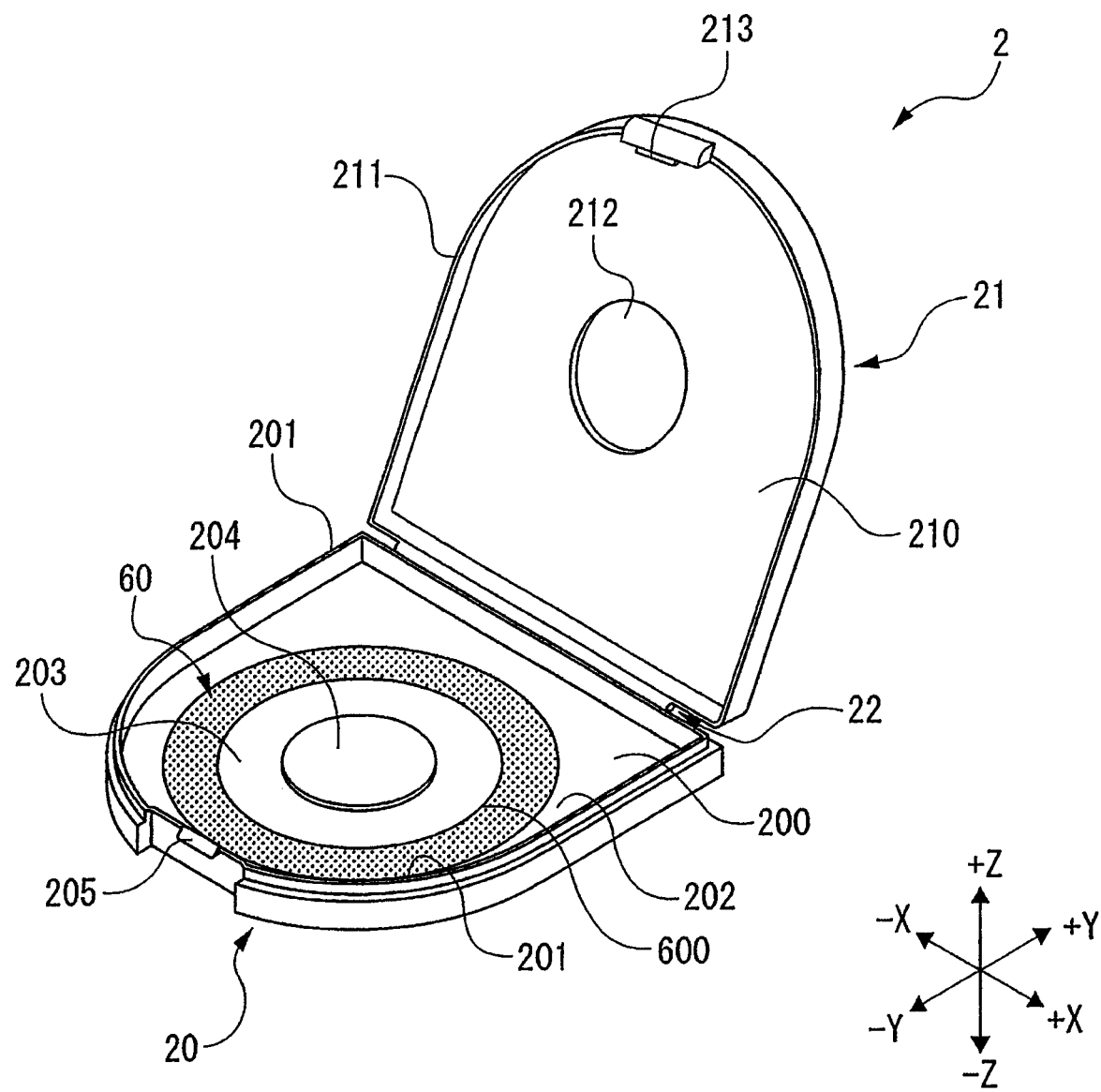
FIG. 12 is a perspective view of a storage case storing therein a blade having one surface thereof exposed.

The air guide member 78 has an inside diameter larger than the outside diameter of the blade 60 shown in FIG. 12.

Figure 11:
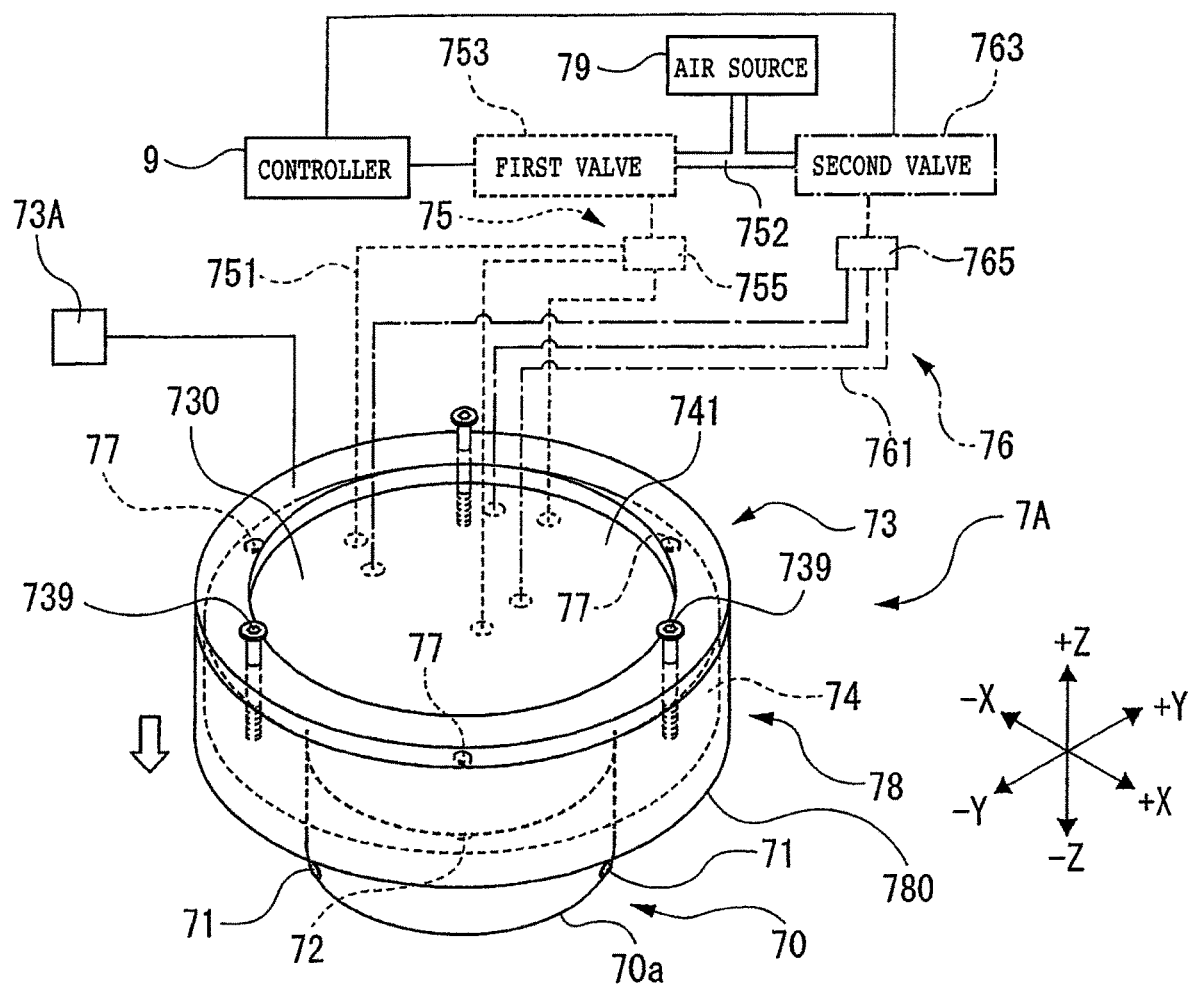
FIG. 11 is a perspective view of the blade mounting and dismounting jig, showing the manner in which an air guide surface of the air guide member is positioned in the direction of travel of air ejected radially outwardly from second air ejection ports defined in a jig body.

As shown in FIG. 11, pressing means 73A such as a piston cylinder or the like, for example, is connected to the auxiliary plate 73. When the pressing means 73A presses the auxiliary plate 73 toward the grip 74, the resilient members 77 are compressed from the free state and the air guide member 78 moves in a thicknesswise direction, i.e., the −Z-axis direction, of the jig body 70. As a result, the distal end 780 of the air guide member 78 is positioned beyond the second air ejection ports 72 of the jig body 70 in the −Z-axis direction, and the air guide member 78 surrounds the second air ejection ports 72 and part of the side face 70*d* of the jig body 70. Rather than the pressing means 73A, the operator may press the auxiliary plate 73 toward the grip 74.

FIG. 12 shows in perspective a storage case 2 for storing the blade 60 therein. As shown in FIG. 12, the storage case 2 includes a storage housing 20 for storing the blade 60 therein and a lid 21 for preventing the blade 60 stored in the storage housing 20 from dropping out. The storage case 2 serves as a case for storing the blade 60 before it is used.

The storage housing 20 and the lid 21 are made of a transparent or semitransparent synthetic resin such as polypropylene or the like. The storage housing 20 and the lid 21 are each of a partly rectangular shape with two adjacent round corners. The storage housing 20 and the lid 21 have respective sides remote from the round corners, coupled to each other by a hinge 22.

The storage housing 20 has a bottom plate 200 and a side wall 201 extending upwardly from the outer peripheral edge of an upper surface of the bottom plate 200. An area of the storage housing 20 which area lies inside of the side wall 201 serves as a storage area 202 for storing the blade 60. A disk-shaped first land 203 that projects from the upper surface of the bottom plate 200 is provided centrally in the storage area 202.

The first land 203 has a diameter slightly smaller than the diameter of the mount hole 600 in the blade 60. In FIG. 12, the first land 203 is illustrated as engaging in the mount hole 600 in the blade 60 that is placed in the storage area 202. The blade 60 that is stored in the storage area 202 and placed on the bottom plate 200 with the first land 203 engaging in the mount hole 600 is prevented from moving radially. The thickness of the first land 203 is the same as or slightly larger than the thickness of the blade 60.

A disk-shaped second land 204 is provided centrally on the first land 203 and projects further upwardly from the first land 203. The second land 204 has a diameter smaller than the diameter of the first land 203. The center of the second land 204 is essentially aligned with the center of the first land 203. A first hook 205 that projects outwardly as part of lock means is disposed on an outer side of the side wall 201 that is positioned opposite the hinge 22.

The lid 21 has a top plate 210 and a side wall 211 provided on the outer peripheral edge of a lower surface of the top plate 210. The side wall 201 of the storage housing 20 has an outer step in its upper end face. When the lid 21 is closed over the storage housing 20, the side wall 211 of the top plate 210 has its lower end face brought into abutment against the outer step in the upper end face of the side wall 201. The top plate 210 has a cavity 212 defined centrally in the lower surface thereof and shaped complementarily to the second land 204 on the storage housing 20. A second hook 213 that projects inwardly and cooperates with the first hook 205 in making up the lock means is disposed on an inner side of the side wall 211 that is positioned opposite the hinge 22.

The storage case 2 thus constructed operates as follows: When the lid 21 is turned about the hinge 22 and closed over the storage housing 20, it closes the storage area 202 that is storing the blade 60 which is fitted over the first land 203. The lid 21 remains locked over the storage housing 20 when the first hook 205 and the second hook 213 engage each other. With the lid 21 closed over the storage housing 20, the second land 204 on the storage housing 20 is fitted in the cavity 212 in the lid 21, and the lower surface of the top plate 210 abuts against the first land 203. Therefore, even when the storage case 2 that stores the blade 60 therein is wobbled or otherwise moved, the blade 60 is securely held in place in the storage area 202, i.e., is prevented from moving in the storage area 202 in the thicknesswise directions of the blade 60, and is also prevented from being dislodged from the first land 203. When the lid 21 is turned about the hinge 22 away from the storage housing 20, the storage area 202 is opened. The blade 60 with one surface thereof exposed remains stored in the storage area 202, as shown in FIG. 12.

(Extracting the Blade from the Storage Case Using the Blade Mounting and Dismounting Jig According to Embodiment 2)

Steps of a blade extracting method using the blade mounting and dismounting jig 7A according to Embodiment 2 will be described in detail below.

(1) Positioning Step

Figure 13:
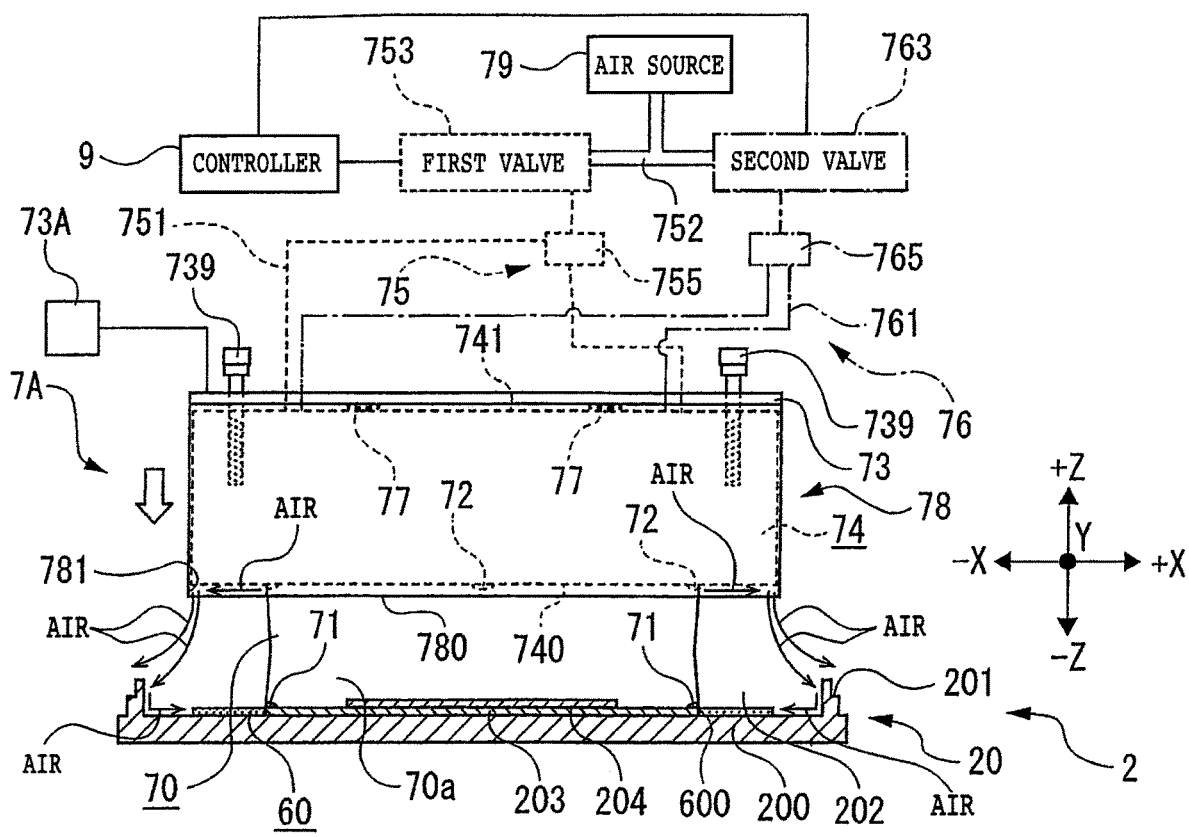
FIG. 13 is a side elevational view showing the manner in which the blade mounting and dismounting jig extracts the blade from the storage case by ejecting air radially outwardly from the second air ejection ports in the jig body fitted in a mount hole defined in the blade.

As shown in FIG. 13, the blade 60 with one surface thereof exposed upwardly is stored in the storage case 2 where the lid 21 has been turned away from the storage housing 20. The operator grips the auxiliary plate 73 of the blade mounting and dismounting jig 7A, causes the distal end portion 70a of the blade mounting and dismounting jig 7A to face the mount hole 600 in the blade 60, and positions the blade mounting and dismounting jig 7A such that the center in an XY plane of the distal end portion 70a is essentially aligned with the center of the mount hole 600 in the blade 60. Then, the operator brings the blade mounting and dismounting jig 7A toward the storage case 2 until the distal end portion 70a of the jig body 70 is fitted in the mount hole 600 in the blade 60 and positioned coaxially therewith in the Z-axis directions. The outside diameter of the air guide member 78 of the blade mounting and dismounting jig 7A is smaller than the diameter of the storage housing 20 of the storage case 2, so that when the distal end portion 70a of the jig body 70 is fitted in the mount hole 600 in the blade 60 and positioned coaxially therewith, the air guide surface 781 of the air guide member 78 is positioned inwardly of an inner peripheral surface of the side wall 201 of the storage housing 20.

(2) Extracting Air Ejecting Step

Then, the pressing means 73A is actuated to press the auxiliary plate 73 in the −Z-axis direction. As a result, the resilient members 77 are compressed from the free state by being pressed by the lower surface of the auxiliary plate 73. The auxiliary plate 73 and the air guide member 78 fixed thereto are moved in the −Z-axis direction until the second air ejection ports 72 and the air guide surface 781 as the inner side surface of the air guide member 78 face each other in the horizontal directions.

The controller 9 energizes the solenoid of the second valve 763 to open the second valve 763. The controller 9 keeps the first valve 753 closed. The controller 9 actuates the air source 79 to supply compressed air under high pressure to the T-shaped pipe 752. The compressed air flows through the second fluid communication route 76, and is ejected out of the second air ejection ports 72.

(3) Guiding Step

The ejected air is guided to flow toward the blade 60 by the air guide surface 781. Specifically, as shown in FIG. 13, the compressed air ejected from the second air ejection ports 72 flows radially outwardly and reaches the air guide surface 781 positioned in the direction of travel of air. The compressed air that has reached the air guide surface 781 flows generally along the air guide surface 781 toward the blade 60 that is positioned therebelow. Part of the compressed air flows at a high speed radially outwardly between the distal end 780 of the air guide member 78 and the upper end of the side wall 201 of the storage housing 20, and is discharged into the atmosphere. The air flow produces a negative pressure tending to attract the blade 60 in the +Z-axis direction because of the Bernoulli's effect.

Part of the compressed air that flows along the air guide surface 781 toward the blade 60 impinges upon the inner peripheral surface of the side wall 201 of the storage housing 20, and thereafter flows along the inner peripheral surface of the side wall 201 of the storage housing 20 and then the upper surface of the bottom plate 200 radially inwardly toward the blade 60.

(4) Moving Step

While the blade 60 engaging the first land 203 is being lifted by a negative pressure produced between the blade 60 and the grip 74 due to the Bernoulli's effect, the air that flows along the bottom plate 200 enters the gap created upon the lifting of the blade 60 between the side face of the blade 60, i.e., the face of the blade 60 that faces in the −Z-axis direction in FIG. 13, and the bottom plate 200 of the storage housing 20. As the blade 60 is attracted toward the jig body 70 under the negative pressure and lifted by the air entering between the blade 60 and the bottom plate 200, the blade 60 is moved to the jig body 70.

Figure 14:
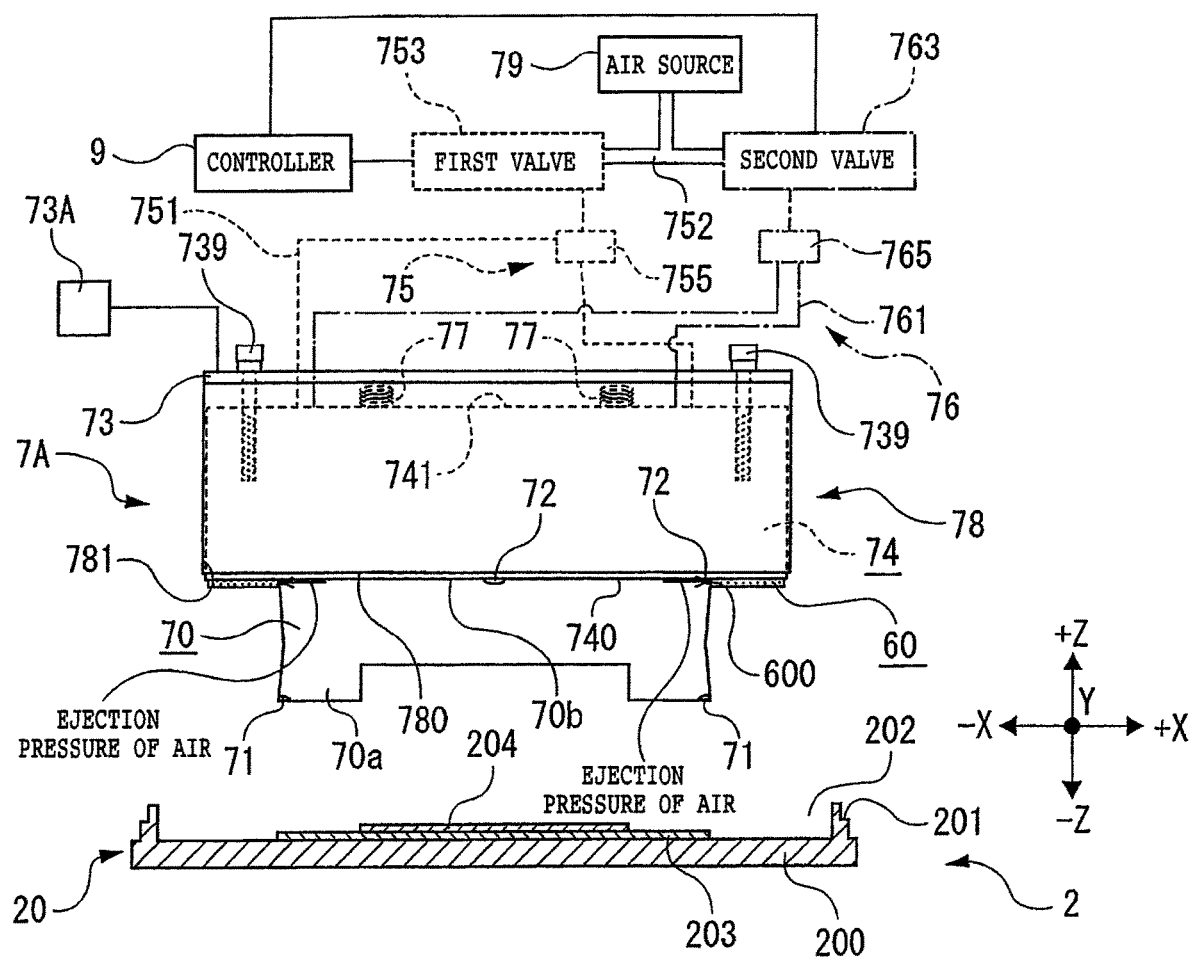
FIG. 14 is a side elevational view showing the manner in which the blade extracted from the storage case is held on the jig body.

As shown in FIG. 14, for example, after the blade 60 has been made closely to the rear end 70b of the jig body 70, the pressing means 73A releases the auxiliary plate 73 from its pressing while the air source 79 continues supplying air to the second air ejection ports 72. As a result, the resilient members 77 spring back to their natural length, positioning the distal end 780 of the air guide member 78 short of the second air ejection ports 72 in the +Z-axis direction so that the air guide member 78 does not surround the side face 70d of the jig body 70 and the second air ejection ports 72. The blade 60 is further moved in the +Z-axis direction and has its side face abuts against the front surface 740 of the grip 74, overlapping the second air ejection ports 72. The air source 79 continues to supply air to the second air ejection ports 72, pressing the blade 60 radially outwardly from the mounting hole 600 side under the pressure of air ejected from the second air ejection ports 72 and supporting the blade 60 in a well-balanced fashion on the jig body 70 under the pressure of ejected air.

In the blade mounting and dismounting method using the blade mounting and dismounting jig 7A according to Embodiment 2, rather than extracting the blade 60 upwardly from the storage case 2 that lies horizontally, the blade 60 may be extracted horizontally from the storage case 2 that stands vertically on its side by moving the blade 60 closely to the rear end 70*b* of the jig body 70 and thereafter stopping supplying air from the air source 79 to the second air ejection ports 72.

As described above, the blade extracting method for extracting the blade 60 from the storage case 2 where the blade 60 is stored with one surface thereof exposed, using the blade mounting and dismounting jig 7A including the air guide member 78 carries out the positioning step of coupling the jig body 70 and the mount hole 600 in the blade 60 to each other and positioning the jig body 70 and the blade 60 coaxially with each other, the extracting air ejecting step of ejecting air radially outwardly from the second air ejection ports 72, and the guiding step of guiding the ejected air in a direction toward the blade 60 with the air guide surface 781 of the air guide member 78, so that it is possible in the subsequent moving step to move the blade 60 onto the jig body 70 in a contactless fashion with a negative pressure produced between the blade 60 and the grip 74 and air entering between the storage case 2 and the blade 60.

The blade mounting and dismounting jig 7A includes, in addition to the arrangement of the blade mounting and dismounting jig 7 according to Embodiment 1 shown in FIG. 4, the air guide member 78 having at least the air guide surface 781 that can be positioned in the direction of travel of air ejected radially outwardly from the second air ejection ports 72. It is thus possible to extract the blade 60 from the storage case 2 where the blade 60 is stored with one surface thereof exposed, and also possible to more effectively prevent the blade 60 from being possibly broken until the blade 60 stored in the storage case 2 is mounted on the flange 61.

Figure 15:
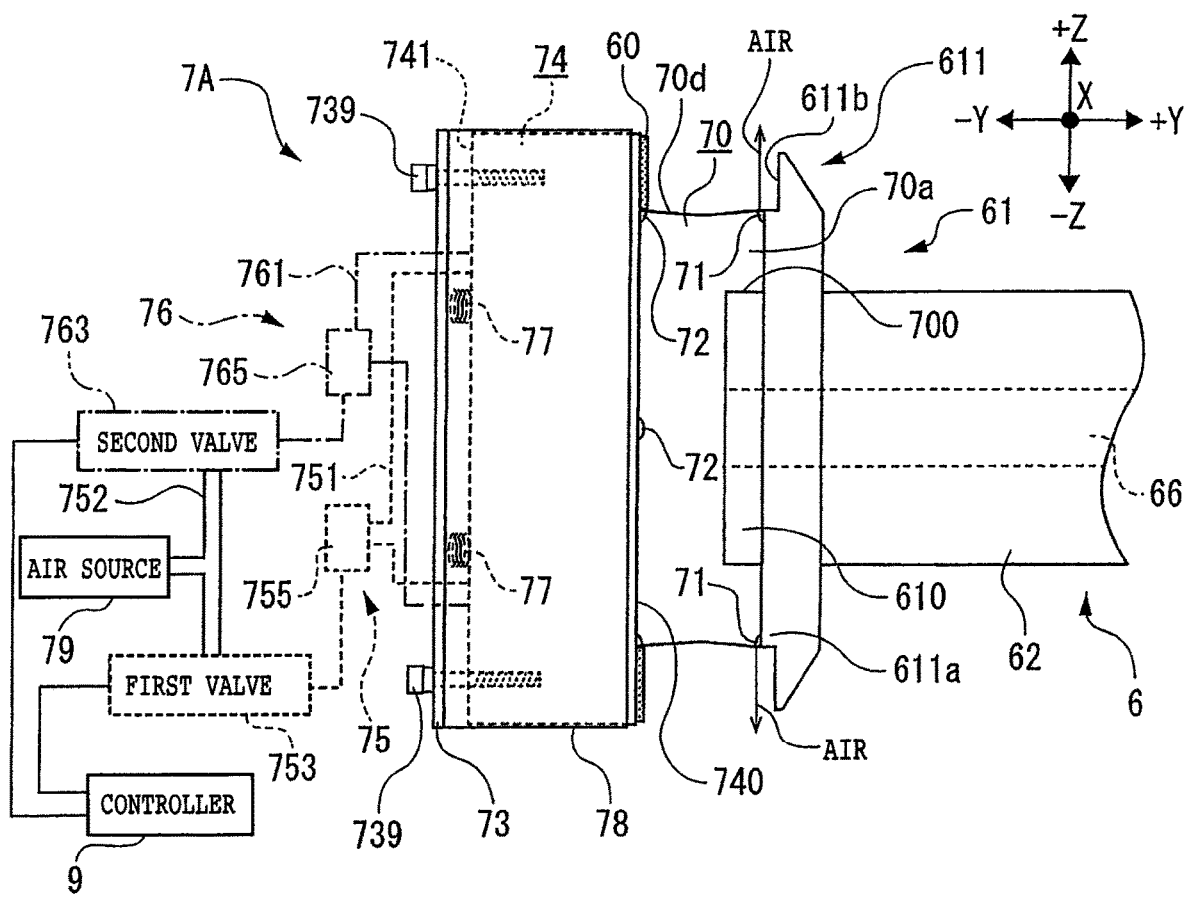
FIG. 15 is a side elevational view showing the manner in which the blade is mounted on the flange using the blade mounting and dismounting jig that is provided with the air guide member.

Next, as shown in FIG. 15, various steps involved in mounting the blade 60 on the flange 61 using the blade mounting and dismounting jig 7A which is holding the blade 60 extracted from the storage case 2 will be described below.

(1) Positioning Step

The operator grips the grip 74 of the blade mounting and dismounting jig 7A, and positions the blade mounting and dismounting jig 7A such that the distal end portion 70*a* thereof faces the flange 61. The operator moves the blade mounting and dismounting jig 7A toward the flange 61 to cause the boss 610 of the flange 61 to fit into the recess 700 in the blade mounting and dismounting jig 7A until the jig body 70 is coupled to the blade mount 611*a* and positioned coaxially with the flange 61.

(2) Mounting Air Ejecting Step

Then, the controller 9 energizes the solenoid of the first valve 753 to open the first valve 753. The controller 9 keeps the second valve 763 closed. The controller 9 actuates the air source 79 to supply compressed air under high pressure to the T-shaped pipe 752 for a short period of time. The compressed air flows through the first fluid communication route 75 and is instantaneously ejected out of the first air ejection ports 71.

(3) Moving Step

The air that is instantaneously ejected out of the first air ejection ports 71 flows at a high speed radially outwardly between the annular end face 611*b* of the flange member 611 and the side face of the blade 60 that faces in the +Y-axis direction, and is discharged into the atmosphere. The air flow produces a negative pressure tending to attract the blade 60 in the +Y-axis direction due to the Bernoulli's effect, moving the blade 60 under the negative pressure away from the blade mounting and dismounting jig 7A toward the blade mount 611*a* until the blade 60 is fitted over the blade mount 611*a*.

After the blade 60 has moved to the blade mount 611*a*, the operator grips the grip 74 and pulls the blade mounting and dismounting jig 7A away from the boss 610 in the −Y-axis direction. The operator then fits the holder 65 shown in FIG. 2 over the boss 610, and threads the blade fixing nut 63 over the externally threaded outer side surface 610*c* of the boss 610 and tightens the blade fixing nut 63. The blade 60 thus mounted on the flange 61 can be rotated at a high speed about its own axis when the spindle 66 is rotated by the electric motor, not shown.

Various steps involved in dismounting the blade 60 from the flange 61 using the blade mounting and dismounting jig 7A will be described below with reference to FIG. 16.

(1) Positioning Step

Figure 16:
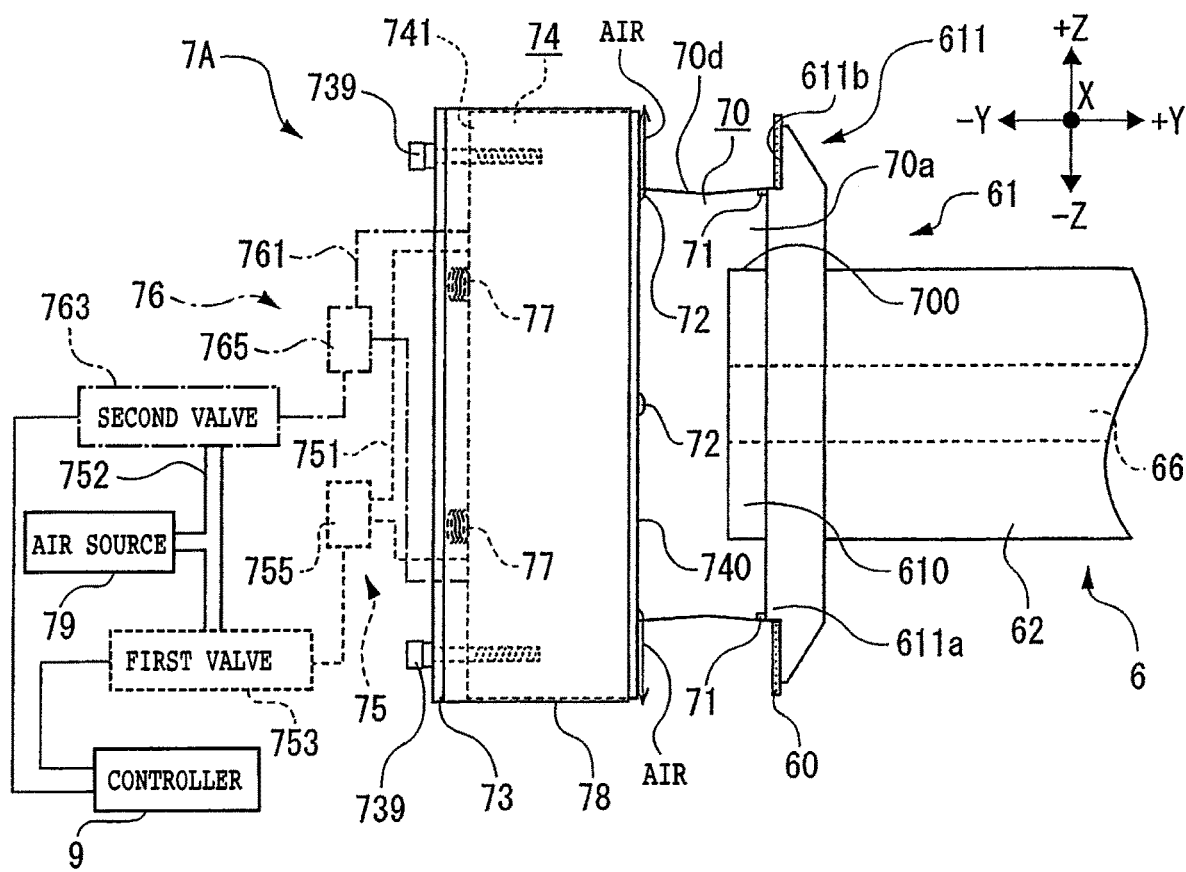
FIG. 16 is a side elevational view showing the manner in which the blade is dismounted from the flange using the blade mounting and dismounting jig that is provided with the air guide member.

The cutting means 6 shown in FIG. 16 is free of the holder 65 and the blade fixing nut 63 shown in FIG. 2 and has the blade 60 fitted over the blade mount 611*a*. The operator grips the grip 74 of the blade mounting and dismounting jig 7A, and positions the blade mounting and dismounting jig 7A such that the distal end portion 70*a* faces the flange 61. The operator moves the blade mounting and dismounting jig 7A toward the flange 61 to cause the boss 610 of the flange 61 to fit into the recess 700 in the blade mounting and dismounting jig 7A until the jig body 70 is coupled to the blade mount 611*a* and positioned coaxially with the flange 61 along the Y-axis directions.

(2) Dismounting Air Ejecting Step

Then, the controller 9 energizes the solenoid of the second valve 763 to open the second valve 763. The controller 9 keeps the first valve 753 closed. The controller 9 actuates the air source 79 to supply compressed air under high pressure to the T-shaped pipe 752 for a short period of time. The compressed air flows through the second fluid communication route 76 and is instantaneously ejected out of the second air ejection ports 72.

(3) Moving Step

The air that is instantaneously ejected out of the second air ejection ports 72 flows at a high speed radially outwardly between the side face of the blade 60 that faces in the −Y-axis direction and the front face 740 of the grip 74, and is discharged into the atmosphere. The air flow produces a negative pressure tending to attract the blade 60 in the −Y-axis direction due to the Bernoulli's effect, moving the blade 60 under the negative pressure away from the blade mount 611*a* toward the jig body 70 of the blade mounting and dismounting jig 7A until the blade 60 is removed from the blade mount 611*a*.

Using the blade mounting and dismounting jig 7A in the manner described above, the blade 60 can be extracted in a contactless fashion from the storage case 2, can be mounted in a contactless fashion on the flange 61, and can be dismounted in a contactless fashion from the flange 61.

The cutting apparatus 1 shown in FIG. 1 which has been described above further includes an automatic blade changer mechanism 8 for automatically mounting the blade 60 on and dismounting the blade 60 from the flange 61 shown in FIG. 2. The automatic blade changer mechanism 8 is disposed near the cutting means 6 in the cutting area E2, for example. The automatic blade changer mechanism 8 includes a blade rack 80 for storing a blade 60 to be used, referred to as "fresh blade 60," and a blade 60 that has been used, referred to as "used blade 60," and blade changing means 81.

Figure 17:
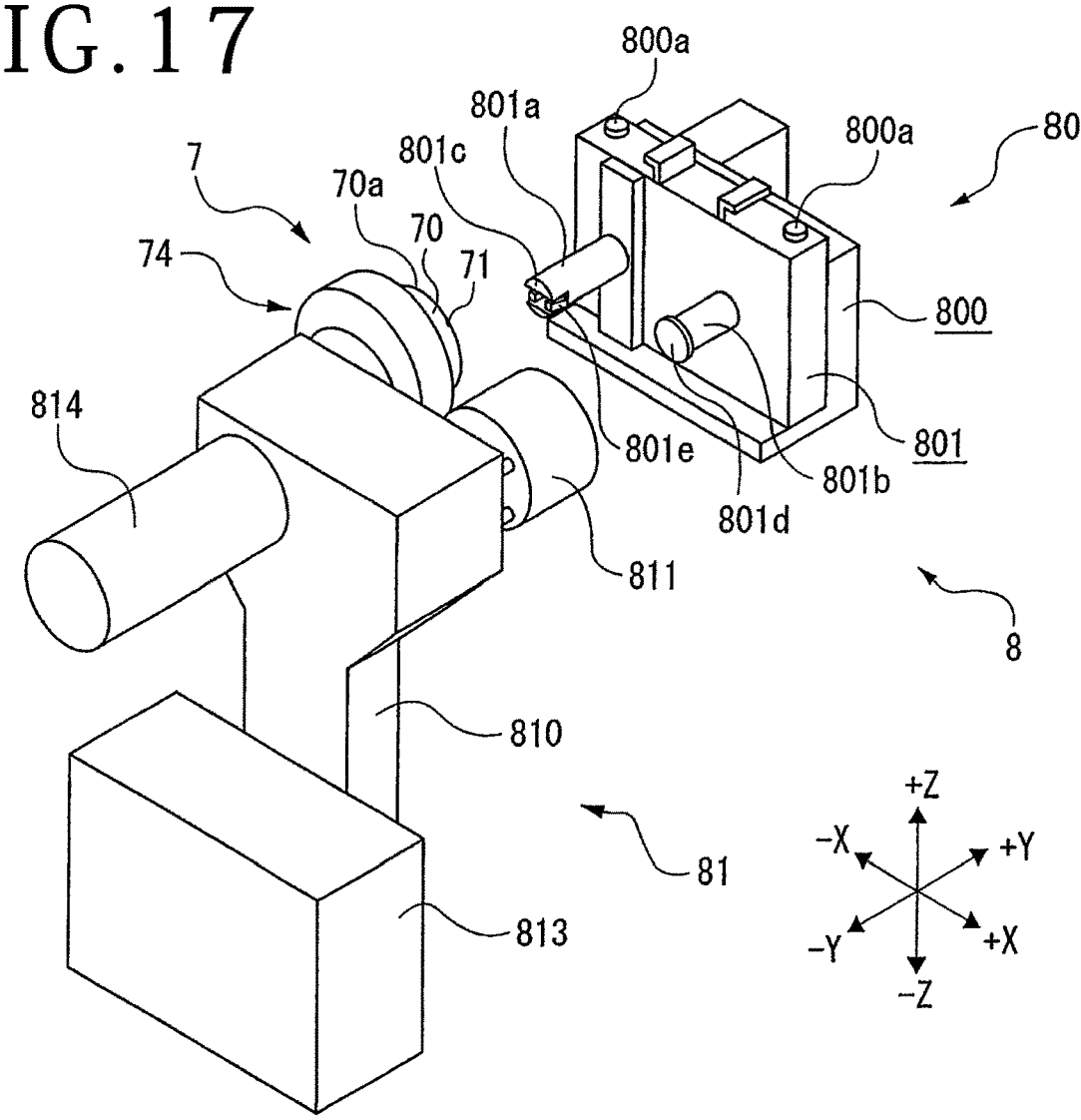
FIG. 17 is a perspective view of an automatic blade changer mechanism of the cutting apparatus.

The blade rack 80 includes a frame 800 which has an L-shaped vertical cross section and is attached by a bracket 181 to an upper portion of a partition wall 180 having a chevron-shaped vertical cross section as viewed in the +X-axis direction, and a movable body 801 detachably mounted on a pair of columns 800a of the frame 800. As shown in FIG. 17, the movable body 801 is illustrated as being mounted on the frame 800. The movable body 801 can be detached from the frame 800 as the columns 800a are pulled out of the movable body 801 when the movable body 801 is lifted off the frame 800.

On a front face of the movable body 801, there are juxtaposed a first holder shaft 801a for holding a fresh blade 60 (not shown in FIG. 17) and a second holder shaft 801b for holding a used blade 60 (not shown in FIG. 17). Stoppers 801c and 801d are provided respectively on the distal ends of the first and second holder shafts 801c and 801d for preventing the blades 60 from being dislodged therefrom. Though a single fresh blade 60 may be held on the blade rack 80, two or more fresh blades 60 may be held on the blade rack 80.

The stopper 801c on the first holder shaft 801a includes a pair of movable fingers 801e that are openable and closable in the X-axis directions under the biasing force of a spring, not shown. The movable fingers 801e can be opened and closed by moving means, not shown, disposed in the frame 800. For the stopper 801c, when the blade 60 is to be removed from the first holder shaft 801a, the movable fingers 801e are moved radially inwardly of the first holder shaft 801a from an open position to a closed position.

The stopper 801d on the second holder shaft 801b is a fixed stopper in the shape of a flange that is slightly smaller in diameter than the mount hole 600 in the blade 60 shown in FIG. 2. The stopper 801d serves to prevent the blade 60 that is loosely fitted over the second holder shaft 801b from being dislodged.

The blade changing means 81 is disposed in front of the partition wall 182 as shown in FIG. 1, and faces the blade rack 80 along the Y-axis directions. The blade changing means 81 includes an arm 810 that can be turned about an axis along the Y-axis directions between the blade rack 80 and the spindle 66 of the cutting means 6, and an actuator 813 such as a stepping motor or the like for turning the arm 810. The arm 810 supports on its upper end shown in FIG. 1 the blade mounting and dismounting jig 7 shown in FIG. 4 and an attaching/detaching unit (attaching/detaching means) 811 for attaching and detaching the holder 65.

The blade mounting and dismounting jig 7 and the attaching/detaching unit 811 are illustrated as being juxtaposed on the upper end of the single arm 810 in FIGS. 1 and 17. However, the blade mounting and dismounting jig 7 and the attaching/detaching unit 811 may be disposed on respective ends of two separate arms.

The blade rack 80 illustrated in FIG. 17 is arranged to hold a fresh blade 60 directly on the first holder shaft 801a and to hold a used blade 60 directly on the second holder shaft 801b. However, the blade rack 80 is not limited to such a structure. For example, the storage case 2 shown in FIG. 12 that stores a blade 60 with one surface thereof exposed therein and an empty storage case 2 for storing a blade 60 therein may be mounted on the front face of the movable body 801, and a fresh blade 60 may be extracted from the first-mentioned storage case 2 and a used blade 60 may be stored in the empty storage case 2. According to this modification, the blade mounting and dismounting jig 7A according to Embodiment 2 shown in FIG. 10 may be disposed on the upper end of the arm 810.

An openable and closable cover 183, which is indicated by the imaginary or two-dot-and-dash lines in FIG. 1, is provided on the partition wall 182 and automatically slidable between an open position exposing the cutting means 6 and a closed position covering the cutting means 6 by an air cylinder or the like, not shown. When the openable and closable cover 183 is slid to the open position, the cutting area E2 is exposed to make it possible to change the blade 60 on the cutting means 6. When the openable and closable cover 183 is slid to the closed position, the cutting area E2 is covered to prevent cutting water and so forth from being scattered around at the time a wafer is diced by the cutting means 6.

The blade mounting and dismounting jig 7 is movable back and forth in the Y-axis directions by a piston cylinder 814 mounted on the arm 810.

The attaching/detaching unit 811 for attaching and detaching the holder 65 includes a mechanism, not shown, for removing the blade fixing nut 63 shown in FIG. 2 from and placing the blade fixing nut 63 on the boss 610 and also for removing the flange fixing bolt 64 from the spindle 66 and placing the flange fixing bolt 64 in the spindle 66, and also includes a mechanism for fitting the holder 65 over the boss 610 and removing the holder 65 from the boss 610.

A process of replacing a used blade 60 using the automatic blade changer mechanism 8 will be described below. The blade 60 of the cutting means 6 shown in FIG. 1 needs to be replaced with a fresh one when it has cut a plurality of wafers. First, the arm 810 is turned in the direction indicated by the arrow R1 to a position where the attaching/detaching unit 811 faces the spindle 66. The attaching/detaching unit 811 removes the blade fixing nut 63, the flange fixing nut 64, and the holder 65 shown in FIG. 2 from the cutting means 6. Thereafter, the arm 810 is further turned in the direction indicated by the arrow R1 to a position where the blade mounting and dismounting jig 7 faces the used blade 60 mounted on the flange 61 shown in FIG. 2.

Then, the (1) positioning step through the (3) moving step, described above, of the blade mounting and dismounting method in dismounting the blade 60 from the flange 61 are carried out to dismount the blade 60 from the flange 61, and the blade mounting and dismounting jig 7 holds the dismounted blade 60. At this time, the piston cylinder 814 controls the fitting of the jig body 70 over the boss 610 of the cutting means 6, i.e., the movement of the jig body 70 in the +Y-axis direction, and the pulling of the blade mounting and dismounting jig 7 from the boss 610 of the cutting means 6, i.e., the movement of the jig body 70 in the −Y-axis direction, in the (1) positioning step.

The arm 810 is then turned back in the direction indicated by the arrow R2, which is opposite the direction indicated by the arrow R1, to a position where the blade mounting and dismounting jig 7 faces the second holder shaft 801b of the blade rack 80. Thereafter, the used blade 60 is transferred from the blade mounting and dismounting jig 7 to the second holder shaft 801b.

As described above, the cutting apparatus 1 according to the present invention further includes the automatic blade changer mechanism 8, and the automatic blade changer mechanism 8 includes the blade rack 80 for holding a fresh blade 60 and a used blade 60 and the arm 810 that can be turned between the blade rack 80 and the spindle 66. The arm 810 supports on its end the blade mounting and dismounting jig 7 and the attaching/detaching unit 811 for attaching and detaching the holder 65. In mounting and dismounting the blade 60, the operator is not required to directly touch the blade 60, and the blade 60 is automatically mounted on the flange 61 and dismounted from the flange 61 without forces concentrating on any spot of the blade 60. Therefore, the blade 60 is prevented from being broken and can be mounted and dismounted highly efficiently.

The blade mounting and dismounting jig, the blade mounting and dismounting method, and the cutting apparatus according to the present invention are not limited to the details described above, and the blade mounting and dismounting jigs 7 and 7A and the cutting apparatus 1 are not limited to the illustrated details, but may be changed or modified as far as the advantages of the present invention are effective.

Figure 18:
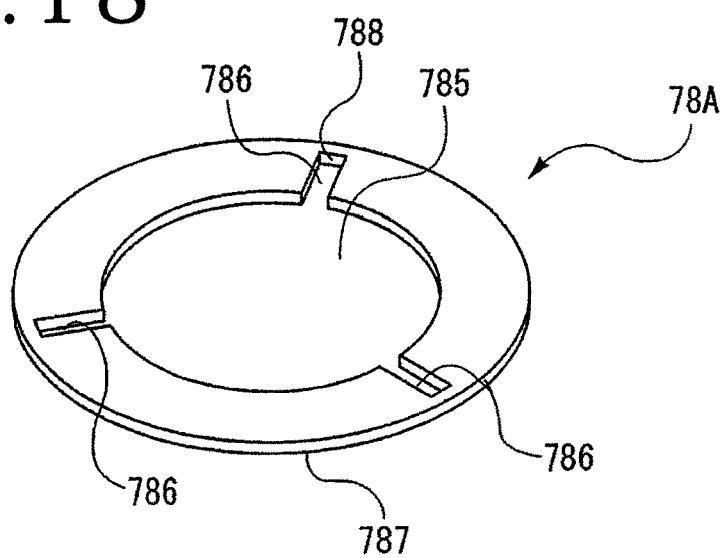
FIG. 18 is a perspective view of another air guide member for use on the blade mounting and dismounting jig.

For example, the air guide member (air guide means) of the blade mounting and dismounting jig 7A according to Embodiment 2 may include a disk-shaped air guide member (air guide means) 78A shown in FIG. 18, which is of substantially the same diameter as the grip 74 and which has a predetermined thickness. The air guide member 78A has an insertion hole 785 defined centrally therein which has a diameter slightly larger than the diameter of the jig body 70 shown in FIG. 13, and three flow passages 786 extending radially outwardly from the insertion hole 785 and circumferentially spaced at equal angular intervals of 120°. The flow passages 786 have respective radially outer ends terminating short of the outer peripheral edge of the air guide member 78A, providing air guide surfaces 788. The disk-shaped air guide member 78A is mounted on the jig body 70 shown in FIG. 13 such that the jig body 70 is inserted in the insertion hole 785, the air guide member 78A has a side face 787 held in abutment against the front face 740 of the grip 74, and the second air ejection ports 72 in the jig body 70 are positioned in facing relation to the respective flow passages 876.

In the guiding step of guiding the ejected air in extracting the blade 60 from the storage case 2, the air ejected radially outwardly from the second air ejection ports 72 flows through the flow passages 786 in the air guide member 78A and reaches the air guide surfaces 788 that are positioned in the direction of travel of the air. The air that has reached the air guide surfaces 788 is guided to flow along the air guide surfaces 788 in a direction toward the blade 60.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A blade mounting and dismounting jig for mounting a blade on and dismounting a blade from a flange of a cutting apparatus which includes at least a boss, a blade mount for mounting the blade fitted thereover, the flange having an annular end face for supporting the blade thereon and being fixed to a distal end of a spindle, and a holder that cooperates with the flange in gripping and securing the blade in position, said blade mounting and dismounting jig including:
   a cylindrical jig body having a recess defined in a distal end portion thereof, the distal end portion having a diameter same as that of said blade mount, said recess being receptive of said boss fitted therein;
   a grip coupled to said jig body and having a diameter larger than said jig body;
   a plurality of first air ejection ports defined in the distal end portion of the jig body;
   a plurality of second air ejection ports defined in the jig body at a juncture between said jig body and said grip;
   a first fluid communication route for bringing said first air ejection ports into fluid communication with an air source under control of a controller; and
   a second fluid communication route for bringing said second air ejection ports into fluid communication with the air source under control of the controller.

2. The blade mounting and dismounting jig according to claim 1, further including:
   an air guide member having at least an air guide surface, wherein the air guide surface is moveable between a first position and a second position, wherein when the air guide surface is positioned at the first position, the air guide surface is not positioned in a path of air flow created when air is ejected from the second air ejection ports, and wherein when the air guide surface is positioned at the second position, the air guide surface is positioned in the path of air flow created when air is ejected from the second air ejection ports thereby redirecting the air flow.

3. A blade extracting method for extracting a blade from a storage case storing therein the blade with one surface thereof exposed, using the blade mounting and dismounting jig according to claim 2, including:
   a positioning step of coupling said jig body and a mount hole in said blade to each other and positioning said jig body and said blade coaxially with each other;
   an extracting air ejecting step of ejecting air radially outwardly from said second air ejection ports;
   a guiding step of guiding the ejected air in a direction toward said blade with said air guide surface; and
   a moving step of moving said blade onto said jig body with a negative pressure produced between said blade and said grip and air entering between said storage case and said blade.

4. A blade mounting and dismounting method using the blade mounting and dismounting jig according to claim 1, for mounting the blade held on the jig body of said blade mounting and dismounting jig on said flange, including:
   a positioning step of causing said boss to fit into said recess, coupling said jig body and said blade mount to each other and positioning said jig body and said blade mount coaxially with each other;
   a mounting air ejecting step of instantaneously ejecting air from said first air ejection ports; and
   a moving step of moving said blade to said blade mount under a negative pressure produced between said blade and said flange.

5. The blade mounting and dismounting method using the blade mounting and dismounting jig according to claim 1, for dismounting the blade held on said blade mount, including:
   a positioning step of causing said boss to fit into said recess, coupling said jig body and said blade mount to each other and positioning said jig body and said blade mount coaxially with each other;
   an extracting air ejecting step of instantaneously ejecting air from said second air ejection ports; and
   a moving step of moving said blade to said jig body under a negative pressure produced between said blade and said grip.

6. A cutting apparatus including:
a boss;
a blade mount for mounting a blade fitted thereover;
a flange having an annular end face for supporting the blade thereon and fixed to a distal end of a spindle;
a holder that cooperates with said flange in gripping and securing the blade in position; and
an automatic blade changer mechanism for automatically mounting the blade on and dismounting the blade from said flange;
wherein said automatic blade changer mechanism includes at least a blade rack for storing a blade to be used and a blade that has been used, and an arm that can be turned between said blade rack and said spindle, and
said arm supports on an end thereof the blade mounting and dismounting jig according to claim 1, and said arm also supports on the end thereof an attaching/detaching unit configured to attach and detach said holder.

7. A blade mounting and dismounting jig for mounting a blade on and dismounting a blade from a flange of a cutting apparatus which includes at least a boss, said jig including:
a jig body having a recess defined in a distal end portion thereof, said recess being receptive of said boss fitted therein;
a grip coupled to said jig body and having a diameter larger than said jig body;
a plurality of first air ejection ports defined in the distal end portion of the jig body;
a plurality of second air ejection ports defined in the jig body at a juncture between said jig body and said grip;
a first fluid communication route for bringing said first air ejection ports into fluid communication with an air source under control of a controller; and
a second fluid communication route for bringing said second air ejection ports into fluid communication with the air source under control of the controller.

8. The blade mounting and dismounting jig of claim 7 wherein the plurality of first air ejection ports are circumferentially spaced at equal angular intervals.

9. The blade mounting and dismounting jig of claim 8 wherein the plurality of second air ejection ports are circumferentially spaced at equal angular intervals and wherein second air ejection ports are circumferentially positioned out of axial alignment with the first air ejection ports.

10. The blade mounting and dismounting jig of claim 7 wherein the plurality of first air ejection ports are open in both an annular end face of the distal end portion of the jig body and in a side face of the jig body.

11. The blade mounting and dismounting jig of claim 7 wherein the cutting apparatus comprises, a blade mount for mounting the blade fitted thereover, the flange having an annular end face for supporting the blade thereon and being fixed to a distal end of a spindle, and the cutting apparatus further comprising a holder that cooperates with the flange in gripping and securing the blade in position.

12. The blade mounting and dismounting jig of claim 11 wherein the distal end portion of the jig body has a diameter approximately the same as that of said blade mount.

13. A blade mounting method using the jig according to claim 11, for mounting the blade held on the jig body of said jig onto said flange of the cutting apparatus, comprising:
a positioning the jig and the flange relative to each other such that said boss is positioned within the recess of the jig;
thereafter ejecting air from said first air ejection ports;
whereby said blade moves from the jig body to said blade mount by a negative pressure produced between said blade and said flange.

14. The blade mounting method of claim 13, further comprising coupling said jig body to the cutting apparatus by the positioning of the jig and the flange relative to each other such that said boss is positioned within the recess of the jig, wherein the blade mount is positioned adjacent said jig body and said blade mount is positioned coaxially with the jig body.

15. A blade dismounting method using the jig according to claim 11, for dismounting the blade held on said blade mount, including:
a positioning the jig and the flange relative to each other such that said boss is positioned within the recess of the jig;
thereafter ejecting air from said second air ejection ports;
whereby said blade moves from said blade mount to the jig body by a negative pressure produced between said blade and said grip.

16. The blade dismounting method of claim 15, further comprising coupling said jig body to the cutting apparatus by the positioning of the jig and the flange relative to each other such that said boss is positioned within the recess of the jig, wherein the blade mount is positioned adjacent said jig body and said blade mount is positioned coaxially with the jig body.

17. The blade mounting and dismounting jig according to claim 7, further including:
an air guide member having at least an air guide surface, wherein the air guide surface is moveable between a first position and a second position, wherein when the air guide surface is positioned at the first position, the air guide surface is not positioned in a path of air flow created when air is ejected from the second air ejection ports, and wherein when the air guide surface is positioned at the second position, the air guide surface is positioned in the path of air flow created when air is ejected from the second air ejection ports thereby redirecting the air flow.

18. A blade extracting method for extracting a blade from a storage case storing therein the blade with one surface thereof exposed, using the blade mounting and dismounting jig according to claim 17 wherein the air guide is positioned in the second position, including:
positioning said jig body within a mount hole in said blade with said jig body and said blade being positioned coaxially with each other;
ejecting air radially outwardly from said second air ejection ports whereby the ejected air is guided by the air guide surface in a direction toward said blade;
whereby the blade is moved from the storage case onto said jig body by a negative pressure produced between said blade and said grip and by air entering between said storage case and said blade.

19. The blade mounting and dismounting jig according to claim 7, further including:
an air guide member having at least an air guide surface, wherein the air guide surface is moveable between a first position and a second position, wherein the air guide surface is positioned radially about and spaced from the jig body,
wherein when the air guide surface is positioned at the first position, a distal end of the air guide surface is positioned proximally relative to the second air ejection ports, and, wherein when the air guide surface is positioned at the second position, the distal end of the air guide surface is positioned distally relative to the second air ejection ports.

20. A cutting apparatus including:
a boss;
a blade mount for mounting a blade fitted thereover;
a flange having an annular end face for supporting the blade thereon and fixed to a distal end of a spindle;
a holder that cooperates with said flange in gripping and securing the blade in position; and
an automatic blade changer mechanism for automatically mounting the blade on and dismounting the blade from said flange;
wherein said automatic blade changer mechanism includes at least a blade rack for storing a blade to be used and a blade that has been used, and an arm that can be turned between said blade rack and said spindle, and
said arm supports on an end thereof the blade mounting and dismounting jig according to claim 7, and said arm also supports on the end thereof an attaching/detaching unit configured to attach and detach said holder.

* * * * *